(12) United States Patent
Park et al.

(10) Patent No.: US 7,046,551 B2
(45) Date of Patent: May 16, 2006

(54) NONVOLATILE MEMORIES WITH ASYMMETRIC TRANSISTORS, NONVOLATILE MEMORIES WITH HIGH VOLTAGE LINES EXTENDING IN THE COLUMN DIRECTION, AND NONVOLATILE MEMORIES WITH DECODING CIRCUITS SHARING A COMMON AREA

(75) Inventors: Jongmin Park, Fremont, CA (US); Li-Chun Li, Los Gatos, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 183 days.

(21) Appl. No.: 10/397,478

(22) Filed: Mar. 25, 2003

(65) Prior Publication Data

US 2004/0190343 A1    Sep. 30, 2004

(51) Int. Cl.
*G11C 16/04* (2006.01)
*G11C 16/06* (2006.01)

(52) U.S. Cl. .................... 365/185.17; 365/185.18; 365/185.23

(58) Field of Classification Search ........... 365/185.11, 365/185.17, 185.22, 185.29, 185.33, 185.23
See application file for complete search history.

(56) References Cited

U.S. PATENT DOCUMENTS

| 5,513,146 | A | * | 4/1996 | Atsumi et al. | ......... 365/185.18 |
| 5,526,318 | A | | 6/1996 | Slemmer et al. | |
| 5,590,077 | A | | 12/1996 | Lee | |
| 5,644,531 | A | | 7/1997 | Kuo et al. | |
| 5,663,903 | A | | 9/1997 | Guo | |
| 5,673,224 | A | | 9/1997 | Chevallier et al. | |

(Continued)

OTHER PUBLICATIONS

Mai, Kenneth W. et al. "Low-Power SRAM Design Using Half-Swing Pulse-Mode Techniques," IEEE Journal of Solid-State Circuits, vol. 33, No. 11, Nov. 1998, pp. 1659-1671.

(Continued)

*Primary Examiner*—Trong Phan
(74) *Attorney, Agent, or Firm*—Michael Shenker; MacPherson Kwok Chen & Heid LLP

(57) ABSTRACT

Nonvolatile memory cells (110) are connected to a bitline (BL 170). The bitline is also connected to a source/drain region (620) of a transistor (610), a Y multiplexer transistor for example. This source/drain region is exposed to a higher voltage, and hence is made to have a higher junction breakdown voltage, than the other source/drain region (630) of the same transistor. A nonvolatile memory has a plurality of memory arrays (106), a global decoder (438) and secondary decoders (440). The selection signals provided by the global decoder to the secondary decoders for selecting the control gate lines (140) and the source lines (152) are carried by lines (450) running in the row direction. These signals are low voltage signals (between 0V and Vcc). The super high voltages are carried by lines (460) extending in the column direction to reduce noise injection into the control gate lines, source lines, and wordlines (150), and to reduce the parasitic capacitance associated with the super high voltage lines. An integrated circuit has at least two memory arrays (106) with control gate lines (140), source lines (152), and wordlines (150). A global decoder (438) and secondary decoders (440) select the control gate lines and the source lines. Each secondary decoder is located in an area spaced from the arrays. The control gate line and source line decoding circuits in each secondary decoder share a common area to reduce the memory size. Other features are also provided.

39 Claims, 21 Drawing Sheets

U.S. PATENT DOCUMENTS

| | | |
|---|---|---|
| 5,717,636 A | 2/1998 | Dallabora et al. |
| 5,748,528 A | 5/1998 | Campardo et al. |
| RE35,838 E * | 7/1998 | Momodomi et al. ... 365/185.17 |
| 5,841,696 A * | 11/1998 | Chen et al. ............ 365/185.11 |
| 5,854,770 A | 12/1998 | Pascucci |
| 5,896,340 A | 4/1999 | Wong et al. |
| 5,898,606 A | 4/1999 | Kobayashi et al. |
| 5,910,916 A * | 6/1999 | Akaogi et al. ......... 365/185.29 |
| 5,932,908 A | 8/1999 | Noble |
| 6,064,623 A | 5/2000 | Ha |
| 6,134,141 A | 10/2000 | Wong |
| 6,233,198 B1 | 5/2001 | Choi |
| 6,243,313 B1 | 6/2001 | Sakamoto et al. |
| 6,262,926 B1 | 7/2001 | Nakai |
| 6,351,413 B1 | 2/2002 | Micheloni et al. |
| 6,421,272 B1 * | 7/2002 | Noguchi ................ 365/185.11 |
| 6,424,569 B1 | 7/2002 | Parker et al. |
| 6,434,055 B1 | 8/2002 | Tanaka et al. |
| 6,438,033 B1 | 8/2002 | Roohparvar |
| 6,442,074 B1 | 8/2002 | Hamilton et al. |
| 6,459,618 B1 | 10/2002 | Wang |
| 2001/0053092 A1 | 12/2001 | Kosaka et al. |
| 2002/0000373 A1 | 1/2002 | Tanzawa et al. |
| 2002/0036923 A1 | 3/2002 | Chung et al. |

OTHER PUBLICATIONS

Atsumi, Shigeru et al. "A 3.3V-only 16Mb Flash Memory with Row-Decoding Scheme," 1996 IEEE International Solid-State Circuits Conference, pp. 42-43, 415.

* cited by examiner

| Signal | | Read | PGM | Erase | Verify |
|---|---|---|---|---|---|
| YAij<0:3> | Sel | Vcc | Vcc | Vcc | Vcc |
|  | Unsel | 0V | 0V | 0V | 0V |
| YAdisij<0:3> | Sel | 0V | 0V | Vcc | 0V |
|  | Unsel | Vcc | 6V | 0V | Vcc |
| GBLi<j> | Sel | ~1.0V | ~0V | Vcc | ~1.0V |
|  | Unsel | 0V | Vcc | Float | 0V |
| VG_BLij | | 0V | Vcc | Vcc | 0V |

Global X Decoder 438

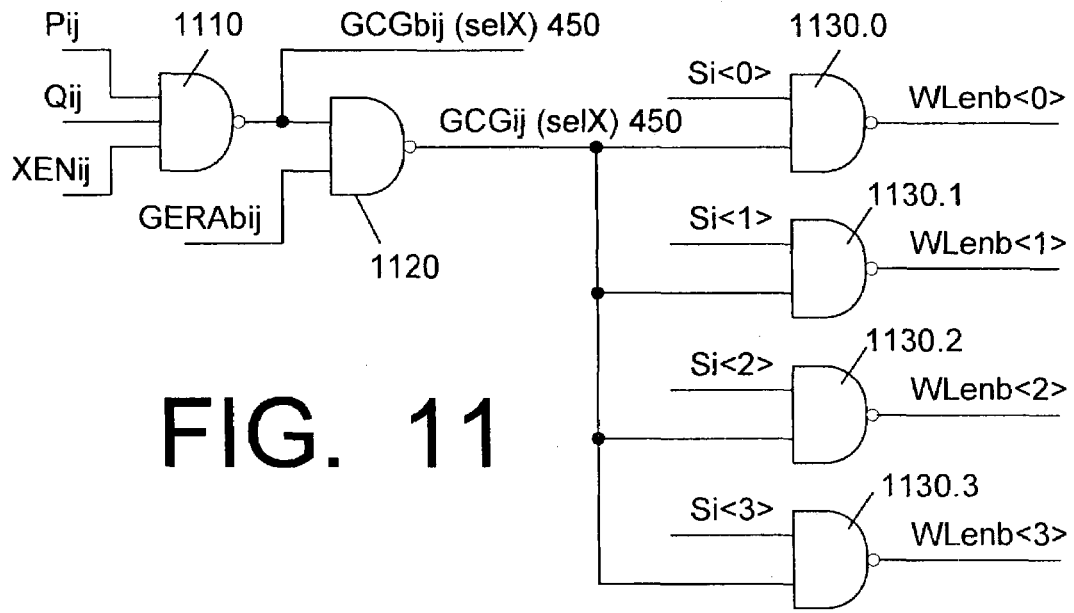

FIG. 11

| Signal | MAT | MATY | Addr | Read | PGM | Erase | Verify |
|---|---|---|---|---|---|---|---|
| Pij (i=0~7, j=0~7) | Sel | | Sel | Vcc | Vcc | Vcc | Vcc |
| | | | Unsel | 0V | 0V | 0V | 0V |
| Qij(i=0~7, j=0~3) | Unsel | | | 0V | 0V | 0V | 0V |
| XENij (i=0~7, j=0~7) | Sel | Sel | | Vcc | Vcc | 0V | Vcc |
| | | Unsel | | 0V | 0V | 0V | 0V |
| | Unsel | | | 0V | 0V | 0V | 0V |
| Si<0:3> (i=0~7) | Sel | | Sel | Vcc | Vcc | Vcc | Vcc |
| | | | Unsel | 0V | 0V | Vcc | 0V |
| | Unsel | | | 0V | 0V | 0V | 0V |
| WLDRVi <0:3> (i=0~7) | Sel | | Sel | Vcc | 2V | 2V | 2.5V |
| | | | Unsel | 0V | 0V | 2V | 0V |
| | Unsel | | | 0V | 0V | 0V | 0V |
| WLRSTi <0:3> (i=0~7) | Sel | Sel | Sel | 0V | 0V | 0V | 0V |
| | | | Unsel | Vcc | Vcc | 0V | Vcc |
| | Unsel | | | Vcc | Vcc | Vcc | Vcc |
| GERAbij (i=0~7, j=0~3) | Sel | | | Vcc | Vcc | 0V | Vcc |
| | Unsel | | | Vcc | Vcc | Vcc | Vcc |

FIG. 12

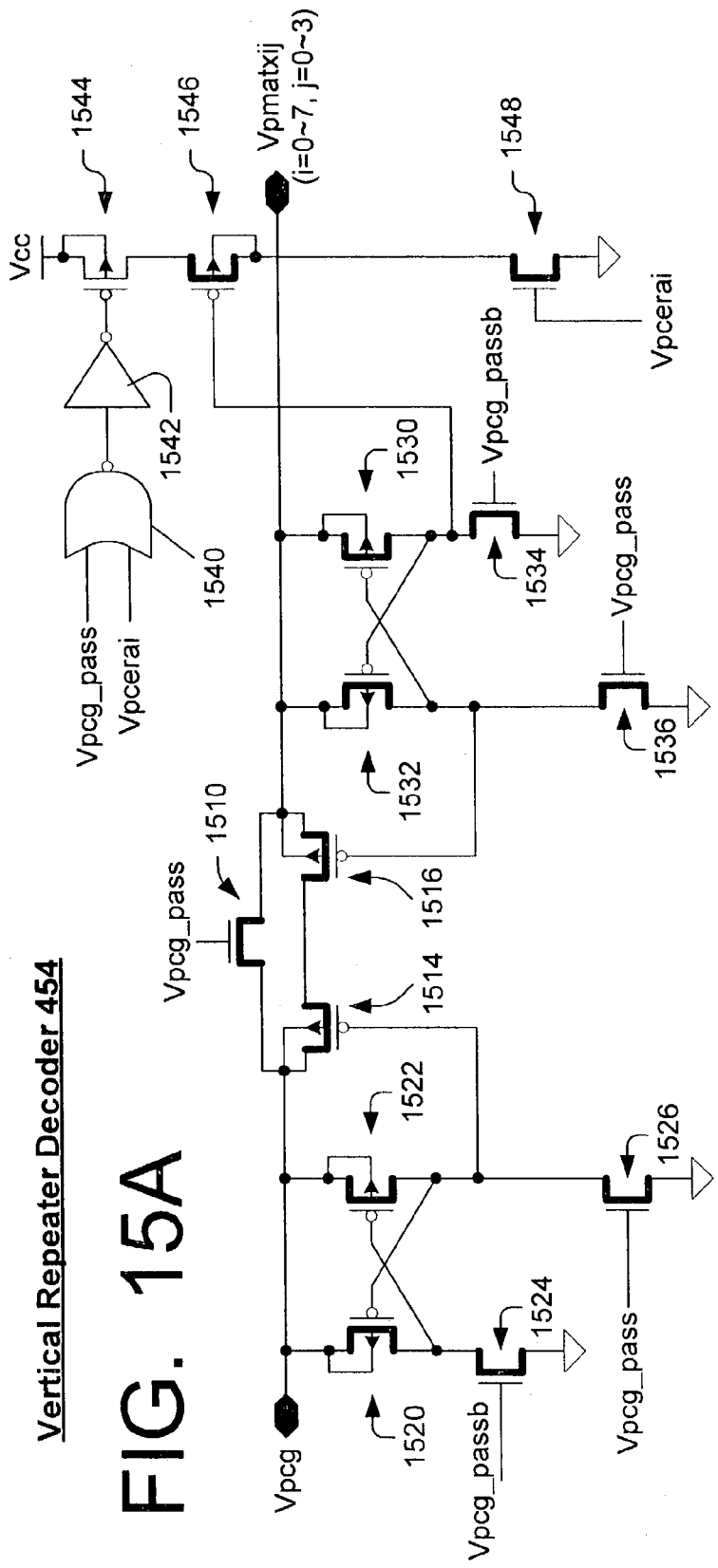
FIG. 15A
Vertical Repeater Decoder 454
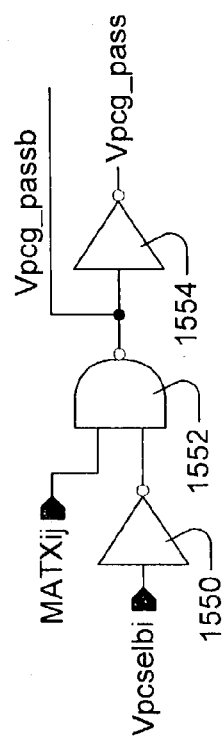
FIG. 15B
FIG. 15C

| MAT | MATX | | Read | PGM | Erase | PGM Verify | Erase Verify |
|---|---|---|---|---|---|---|---|
| Same | Sel | | Vcc | 10V | 0V | 5V | 2V |
| | Unsel | | Vcc | Vcc | 0V | Vcc | 0V |
| Others | | Vpmatxij i=0~7 j=0~3 | Vcc | Vcc | Vcc | Vcc | Vcc |
| | | Vpcg | Vcc | 10V | 0V | 5V | 2V |

FIG. 16

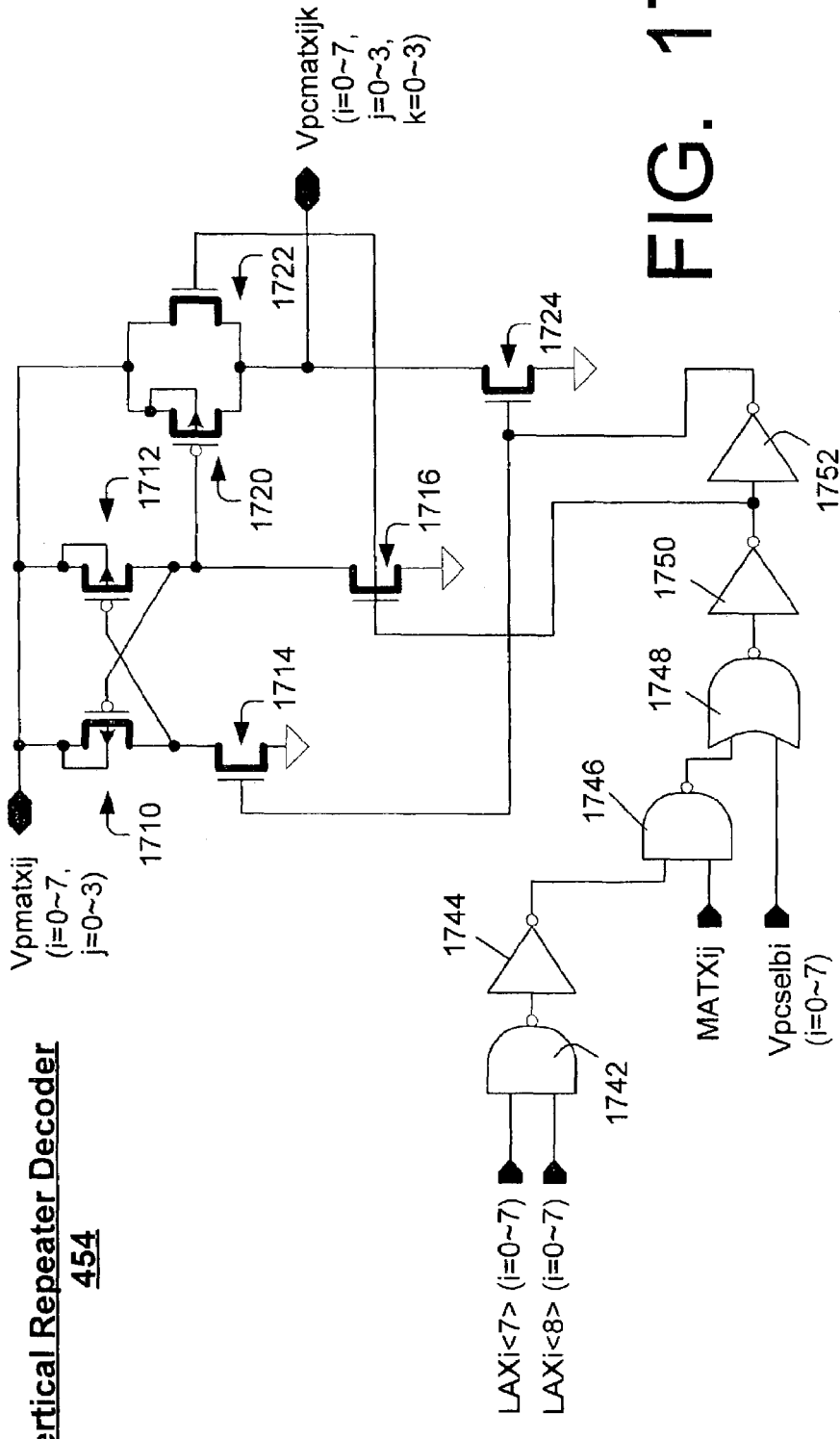

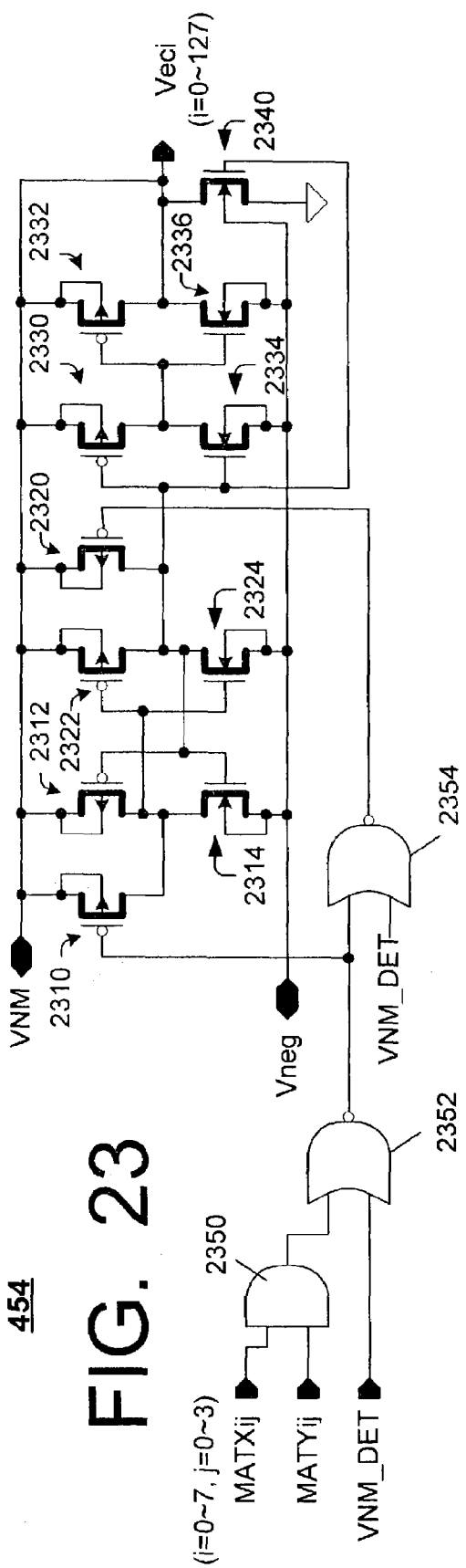
Vertical Repeater Decoder
454
FIG. 23
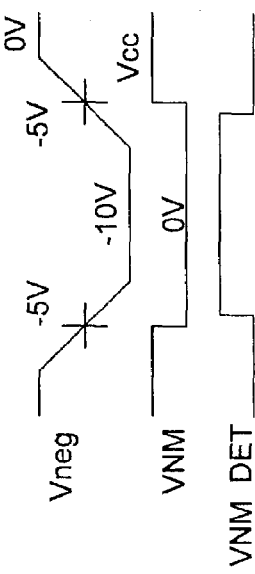
FIG. 25
| Sector | | Read | PGM | Erase |
|---|---|---|---|---|
| Veci | Sel | 0V | 0V | -10V |
| | Unsel | 0V | 0V | 0V |
| Vneg | | 0V | 0V | -10V |
FIG. 24

| Signal | MATY | MATX | Addr | Read | PGM | Erase | Verify |
|---|---|---|---|---|---|---|---|
| GCGij | Sel | | Sel | Vcc | Vcc | Vcc | Vcc |
| | | | Unsel | 0V | 0V | Vcc | 0V |
| | Unsel | | | 0V | 0V | 0V | 0V |
| GCGbij | Sel | | Sel | 0V | 0V | Vcc | 0V |
| | | | Unsel | Vcc | Vcc | Vcc | Vcc |
| | Unsel | | | Vcc | Vcc | Vcc | Vcc |
| Vpmatxij | | Sel | | Vcc | 10V | 0V | 2V/5V |
| | | Unsel | | Vcc | Vcc | 0V | Vcc |
| Vpcmatxij <0:3> | | Sel | | Vcc | 10V | 0V | 2V/5V |
| | | Unsel | | Vcc | 0V | 0V | 0V |
| | | | | Vcc | 10V/0V | 0V | 2V/5V/0V |
| Vpsmatxij <0:3> | | Sel | Sel | 0V | 6V | 0V | 0V |
| | | | Unsel | 0V | 0V | 0V | 0V |
| | | Unsel | | 0V | 6V/0V | 0V | 0V |
| Veci | Sel | | | 0V | 0V | −10V | 0V |
| | | | | 0V | 0V | 0V | 0V |
| | Unsel | | | 0V | 0V | 0V | 0V |

FIG. 27

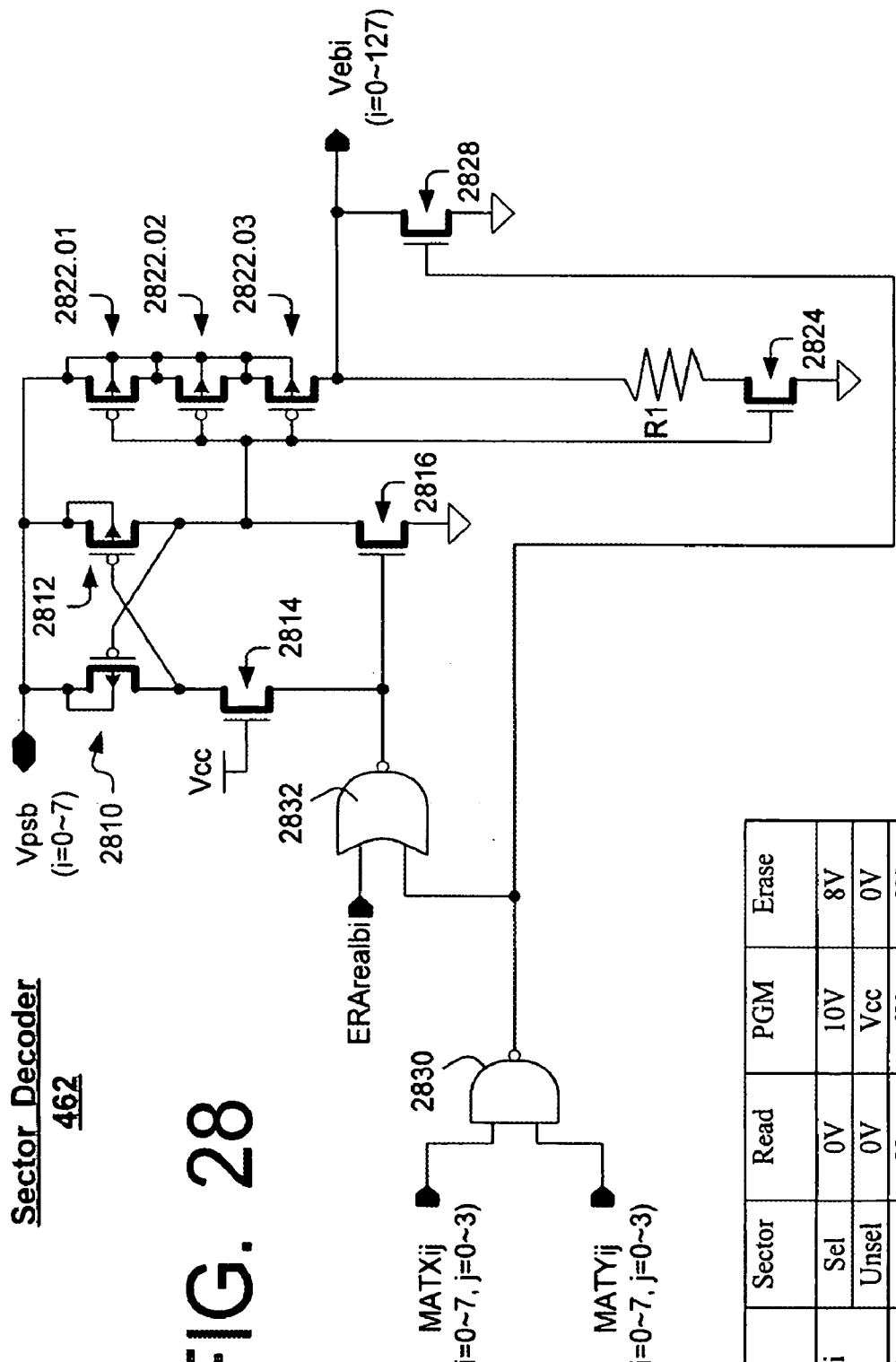

NONVOLATILE MEMORIES WITH ASYMMETRIC TRANSISTORS, NONVOLATILE MEMORIES WITH HIGH VOLTAGE LINES EXTENDING IN THE COLUMN DIRECTION, AND NONVOLATILE MEMORIES WITH DECODING CIRCUITS SHARING A COMMON AREA

BACKGROUND OF THE INVENTION

The present invention relates to nonvolatile memories.

A writing operation performed on a nonvolatile memory typically requires higher voltages. Higher voltages may require transistors with source/drain junctions having higher junction breakdown voltages. Such source/drain junctions undesirably increases the memory size.

Also, the lines carrying the higher voltages inject noise into other lines. It is therefore desirable to reduce the capacitance between the lines carrying the higher voltages and other lines, especially those carrying time sensitive signals. Also, it is desirable to reduce the parasitic capacitance associated with the high voltage lines in order to speed up charging these lines to the high voltages.

In addition, it is desirable to reduce the decoder area.

SUMMARY

This section summarizes some features of the invention. The invention is defined by the appended claims.

According to one aspect of the invention, the number of the source/drain junctions with higher junction breakdown voltages is reduced. This aspect relates to an integrated circuit having a plurality of nonvolatile memory cells connected to a bitline. The bitline is also connected to a transistor (e.g. a Y multiplexer transistor or some other transistor). The transistor has a first source/drain region and a second source/drain region. The bitline is connected to the first source/drain region. The second source/drain region has a lower junction breakdown voltage than the first source/drain region.

This structure is used in some embodiments in which the bitline, and hence the first source/drain region of the transistor, can be exposed to a voltage of a higher magnitude than the second source/drain region. For example, in some embodiments, the second source/drain region is never above Vcc (e.g. 3.0V), but the bitline, and hence the first source drain region, can be above Vcc. Consider for example a memory in which each cell has a source/drain region connected to a bitline, and each cell also has a channel region. The cells are erased through the channel regions as the bitline is floating. The channel regions are driven above Vcc during the erase operation (e.g. to 8.0V). This voltage propagates to the bitline and hence to the first source/drain region of the Y multiplexer transistor. The transistor is off, so its second source/drain region is at or below Vcc. Therefore, the second source/drain region can be made with a lower junction breakdown voltage to reduce the circuit area.

Another aspect of the invention relates to an integrated circuit having a plurality of arrays of nonvolatile memory cells. The cells can be read or written. In a writing operation, at least one voltage applied to the cells is outside of the range of voltages applied in the reading operations. For example, suppose that the reading voltages are in the range from V1 to V2, where V2≧V1, but at least one writing voltage V3 is outside of this range. For illustration, V1 can be ground, V2 can be Vcc, and V3 is some voltage above Vcc. Voltage V3 is applied to some region of the cell ("first region") when the cell is written. The "first region" can be a control gate or a source line region for example.

A first decoding circuit selects the first regions. The first decoding circuit can be a global control gate line decoder or a global source line decoder for example. Also, for each array of memory cells, a second decoding circuit is provided to select the first regions in the array. The second decoding circuit can be a secondary decoder for example. The second decoding circuits receive selection signals from the first decoding circuit on one or more conductive lines "L1". The lines L1 run in the row direction. All of the voltages on the lines L1 are within the range from V1 to V2 both in the reading operation and the writing operation.

In some embodiments, in order to provide the voltage V3 to the cells for the writing operation, a different circuit provides one or more voltages outside of the range from V1 to V2, on a different line or lines L2, but the line or lines L2 run in the column direction.

This is advantageous for example when it is desirable to reduce the noise injection into the lines running in the row direction. In some embodiments, such lines include wordlines, source lines, and control gate lines. Also, the parasitic capacitance associated with the high voltage lines becomes smaller.

According to a third aspect of the invention, an integrated circuit comprises at least two arrays (a "first array" and a "second array") of nonvolatile memory cells. Each memory cell has a conductive floating gate, a conductive control gate, and a conductive select gate which are insulated from each other. In addition, each cell has a "first" source/drain region (e.g. a source line region). In each row of each array, the control gates are electrically connected to each other via a first conductive line (e.g. a control gate line), and the first source/drain regions are electrically connected to each other via a second conductive line (e.g. a source line). The integrated circuit has a first decoding circuit for selecting a plurality of the first conductive lines and a plurality of the second conductive lines. Also, for each of the first and second arrays, a second decoding circuit is provided for selecting one or more, but less than all, of the first conductive lines selected by the first decoding circuit for the corresponding array, and for selecting one or more, but less than all, of the second conductive lines selected by the first decoding circuit for the corresponding array.

Each second decoding circuit is located in an area spaced from the arrays. In some embodiments, since the second decoding circuit selects both the first conductive lines and the second conductive lines, overall area of the integrated circuit is reduced. For example, some embodiments require a minimum spacing between any array and the peripheral circuitry (such as the second decoding circuit). Using the same area for the selection of the first and second conductive lines in the second decoding circuit means that only one minimum spacing has to be provided for the first and second conductive line selection. Also, the transistors used for the first and second conductive line selection can share common wells in a semiconductor substrate.

Other features and embodiments are described below. The invention is by the appended claims.

BRIEF DESCRIPTION OF THE DRAWINGS

FIG. 11 is a circuit diagram of a portion of the memory of FIG. 1.

FIG. 12 is a table of exemplary voltages for the circuit of FIG. 11.

FIGS. 14, 15A, 15B, 15C are circuit diagrams of portions of the memory of FIG. 1.

FIG. 16 is a table of exemplary voltages for the circuits of FIGS. 15A–15C.

FIG. 17 is a circuit diagram of a portion of the memory of FIG. 1.

FIG. 18 is a table of exemplary voltages for the circuit of FIG. 17.

FIG. 23 is a circuit diagram of a portion of the memory of FIG. 1.

FIG. 24 is a table of exemplary voltages for the circuit of FIG. 23.

FIG. 25 is a timing diagram for FIG. 23.

FIG. 27 is a table of exemplary voltages for the circuits of FIGS. 26A, 26B.

FIG. 28 is a circuit diagram of a portion of the memory of FIG. 1.

FIG. 29 is a table of exemplary voltages for the circuit of FIG. 28.

DESCRIPTION OF SOME EMBODIMENTS

Embodiments described in this section illustrate but do not limit the invention. The invention is not limited to a particular memory architecture, memory cell structure, any circuitry, materials, conductivity types, voltage levels, or other details. The invention is defined by the appended claims.

Figure 1:
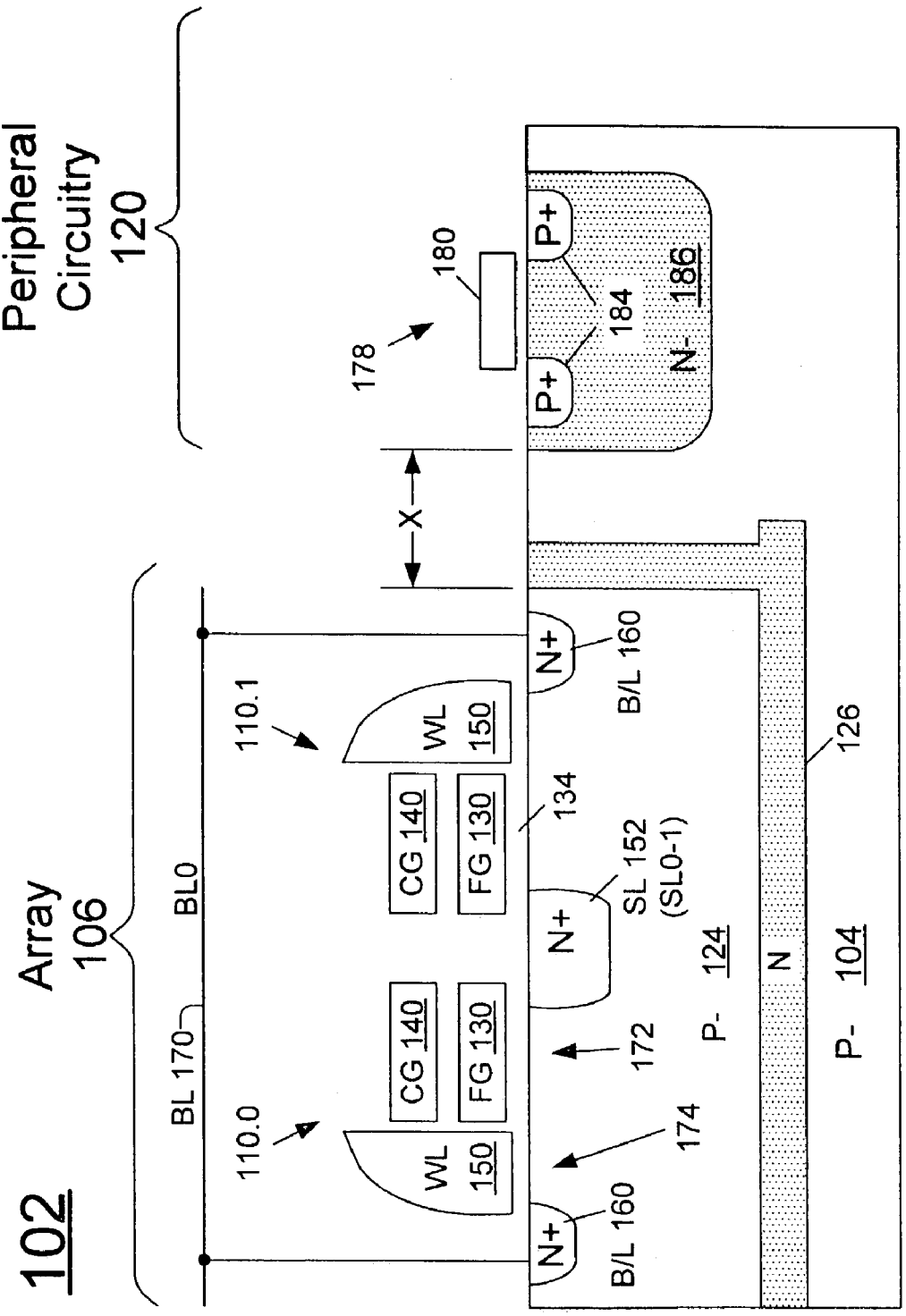
FIG. 1 illustrates a cross section of an integrated circuit comprising a nonvolatile memory according to one embodiment of the present invention.
Figure 2:
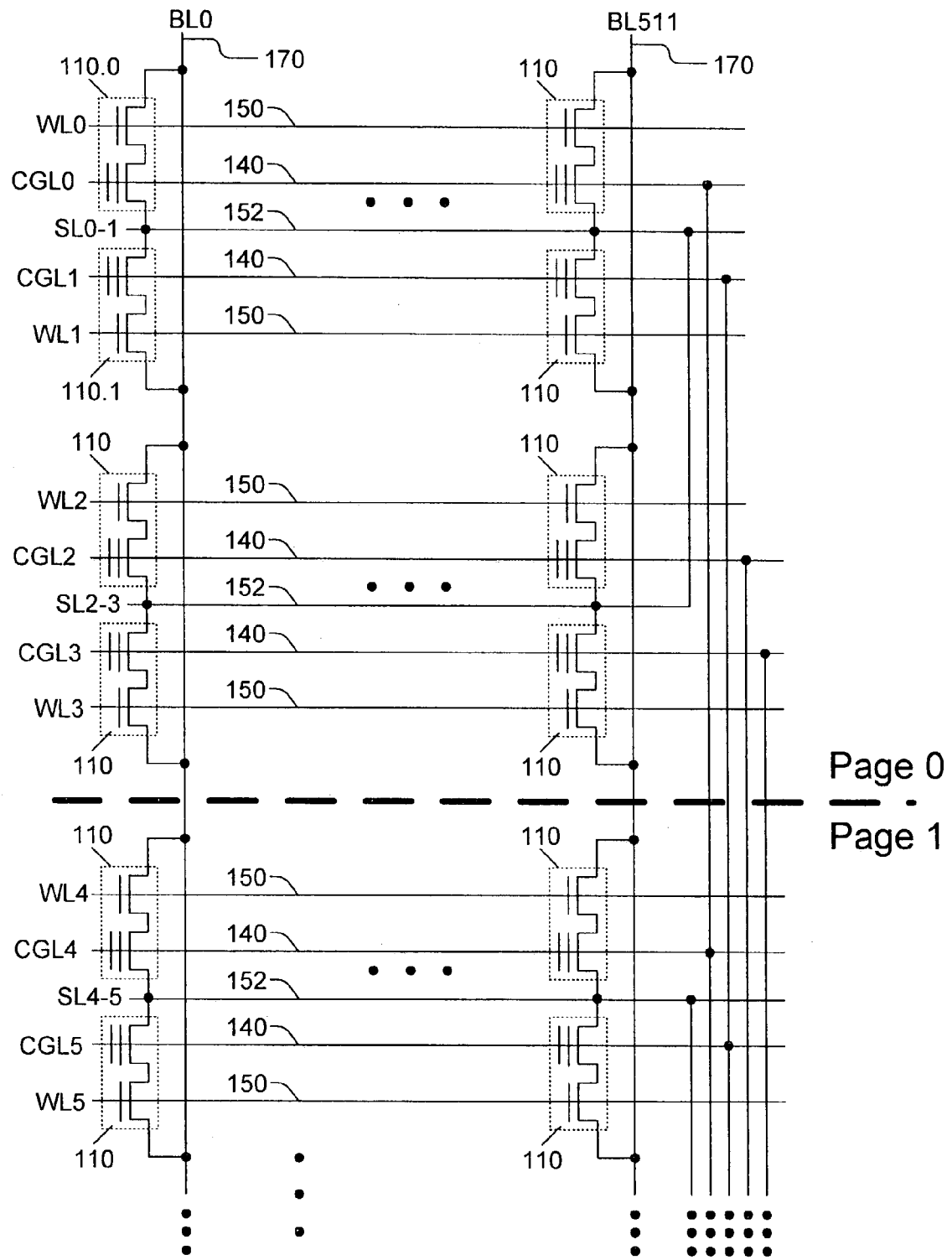
FIG. 2 is a circuit diagram of an array of nonvolatile memory cells in the circuit of FIG. 1.

FIG. 1 shows a memory cross section of an integrated flash memory 102 according to one embodiment of the present invention. The memory is fabricated in and over a P type semiconductor substrate 104 (e.g. monocrystalline silicon). The memory includes an array 106 of memory cells 110 (such as cells 110.0, 110.1). The memory also includes peripheral circuitry 120 (decoders, sense amplifiers, address and data buffers, and/or other circuitry used to access the memory). FIG. 2 shows a circuit diagram of array 106. The features shown in FIGS. 1 and 2 are similar to those described in U.S. patent application Ser. No. 09/972,388 filed Oct. 5, 2001, incorporated herein by reference. See also U.S. Pat. No. 6,355,524 issued Mar. 12, 2002, and U.S. Pat. No. 6,134,144 issued Oct. 17, 2000, both incorporated herein by reference.

As shown in FIG. 1, the memory array is fabricated in and over a P well 124 (doped P-) formed in substrate 104 and isolated from the rest of the substrate by an N type region 126. Each cell 110 includes a conductive floating gate 130 insulated from P well 124 by dielectric 134. Control gate 140 overlies the floating gate. Control gate 140 is part of a conductive control gate line (e.g. polysilicon) that provides control gates for one row of the memory cells. In FIG. 2, the control gate lines for rows 0 through 5 are shown respectively as CGL0 through CGL5. The control gates are insulated from the underlying floating gates by a suitable dielectric. In each row, a conductive wordline 150 provides the select gates for the memory cells. In FIG. 2, the wordlines for rows 0 through 5 are shown respectively as WL0 through WL5. The select gates are positioned side by side with the floating gates and are insulated from the floating and control gates and from P well 124.

Each memory cell 10 has two source/drain regions 152, 160. These are N+ doped regions in P well 124. Region 152 ("source line" region), adjacent to floating gate 130, is part of an N+ source line SL. The source lines run in the row direction. Each source line 152 is shared by two adjacent rows to provide the source line regions 152 for the two rows. In FIG. 2, the source line for rows 0, 1 is shown as SL0–1, the source line for rows 2, 3 is shown as SL2–3, and the source line for rows 4, 5 is shown as SL4–5.

In each column of the memory cells, "bitline" regions 160 are connected to a bitline 170 formed from an overlying conductive layer. In FIG. 2, the bitlines for columns 0 and 511 are shown respectively as BL0, BL511.

In FIG. 2, each cell 10 is represented as a floating gate transistor and a select transistor connected in series. This diagram is not a precise representation of the memory of FIG. 1 because the channel regions 172, 174 of the floating gate transistor and the select transistor are merged together. (Regions 172, 174 are P type regions of P well 124. Region 172 underlies floating gate 130, and region 174 underlies select gate 150.) There is no N type source/drain region between the channel regions 172, 174. Other embodiments include a source/drain region between the two channel regions. Of note, some embodiments are non-flash EEPROM memories.

Peripheral circuitry 120 is shown to contain an PMOS transistor 178 having a gate 180 and also having P+ source/drain regions 184 formed in N well 186 in substrate 104.

In one embodiment, the memory cells 110 are programmed by channel hot electron injection. The cells are erased by Fowler-Nordheim tunneling through channel regions 172 (this erase method is sometimes called "substrate erase" or "bulk erase"). Exemplary voltages are shown below in Table 1. In that table, "Selected" means the memory cell is selected by the address signals. Of note, a wordline, a control gate line, or other lines can be shared by both selected and unselected memory cells. In such cases, the "selected" voltages apply.

TABLE 1

|  | WL 150 | CG 140 | BL 170 | SL 152 | P well 124 |
|---|---|---|---|---|---|
| Read |  |  |  |  |  |
| Selected: | Vcc | Vcc | 1.0 V | 0 V | 0 V |
| Not selected: | 0 V | 0 V | 0 V | 0 V | 0 V |
| Program |  |  |  |  |  |
| Selected: | 2.0 V | 10.0 V | 0 V | 6 V | 0 V |
| Not selected: | 0 V | 0 V | Vcc | 0 V | 0 V |
| Erase: | 2.0 V | −10.0 V | Float | Float | 8 V |

In the embodiment of Table 1, the erase operation erases the whole array, but this is not so in other embodiments. Also, the invention is not limited to any particular programming or erase mechanisms. For example, the cells can be erased through source line regions 152.

Figure 3A:
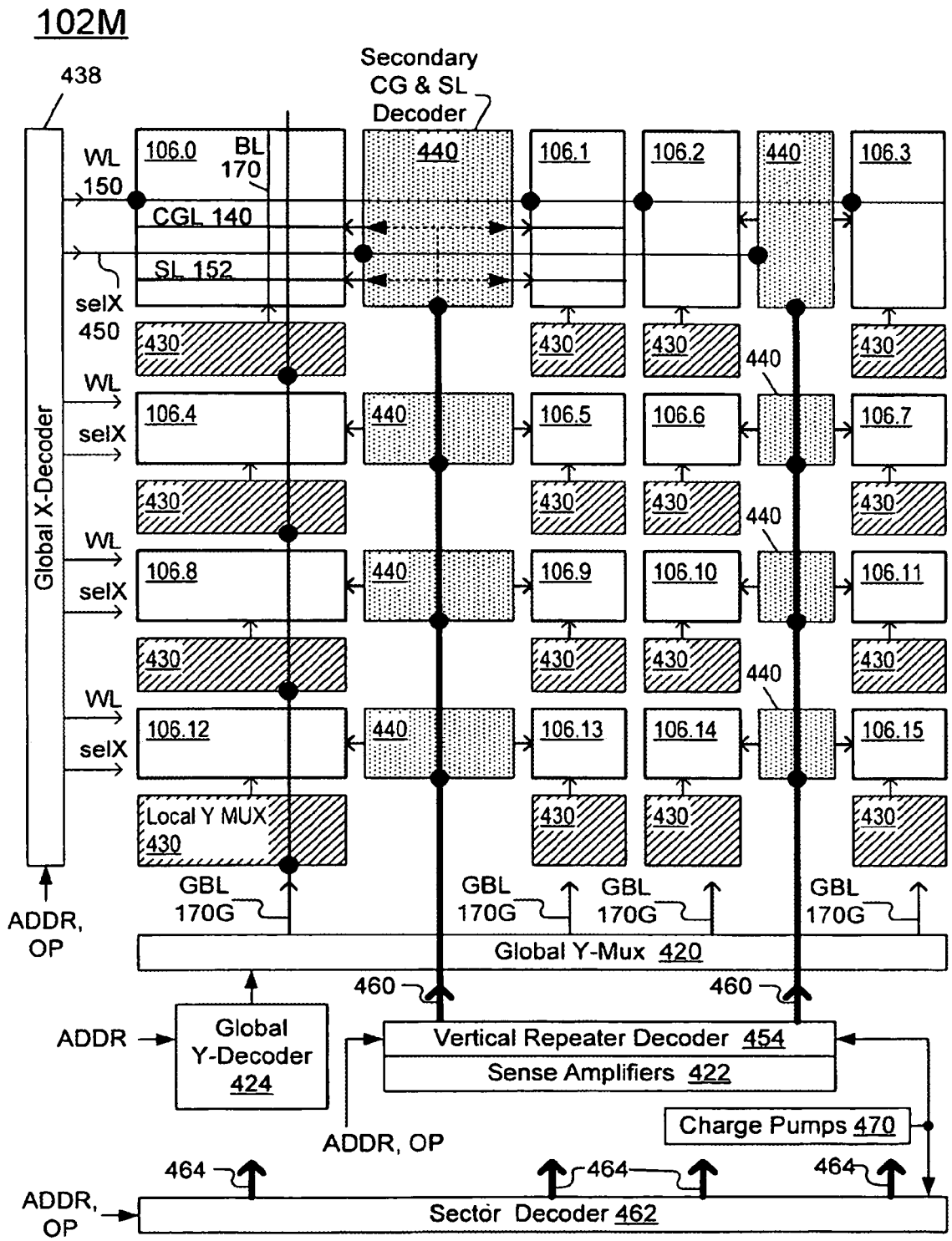
FIGS. 3A, 3B, 4 and 5 are block diagrams for the memory of FIG. 1.
Figure 3B:
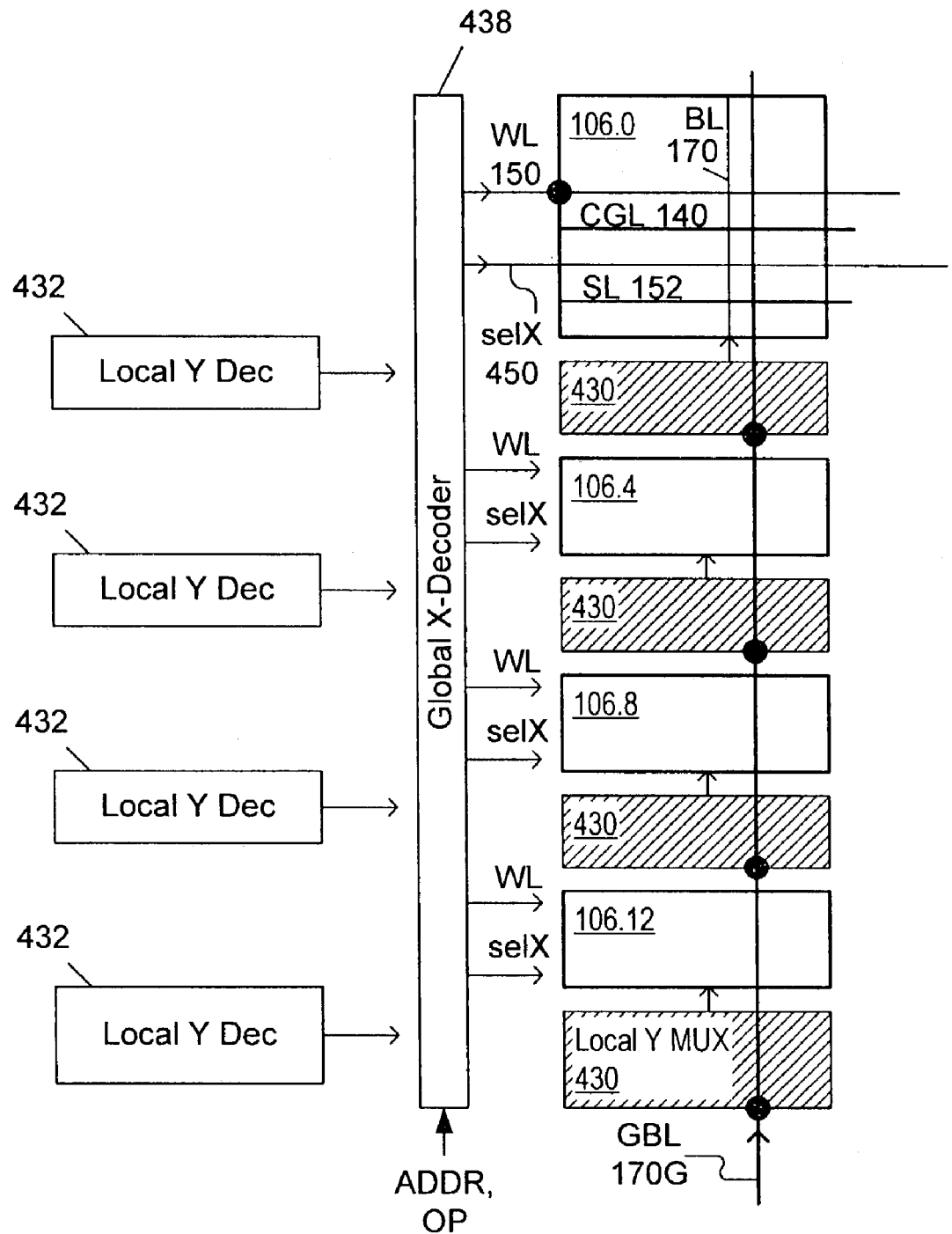

FIG. 3A is a block diagram of a memory mat 102M containing 16 arrays ("sectors") 106.0 through 106.15. FIG. 3B is a block diagram showing additional features. Each of these sectors 106 has the structure of FIGS. 1, 2. Any number of sectors can be present, and further different sectors may have different structure. Memory 102 may contain any number of mats 102M.

In FIGS. 3A, 3B, bitlines 170 run vertically (i.e. in the column direction) through each sector. Wordlines 150, control gate lines 140, and source lines 152 run horizontally (in the row direction). The lines 170, 150, 140, 152 are not necessarily straight, they may curve in order to bypass some feature or for any other reason. Each of these lines may be formed from a single conductive layer or multiple conductive layers. For example, the line may include a jumper from one layer to another to bypass some feature. Bitlines 170 extend vertically (in the column direction) in the sense that each bitline traverses multiple rows. Lines 150, 140, 152 extend horizontally (in the row direction) in the sense that each of these lines traverses multiple columns.

For illustration, we will assume that each sector 106 has 512 wordlines and 1024 bitlines.

Figure 4:
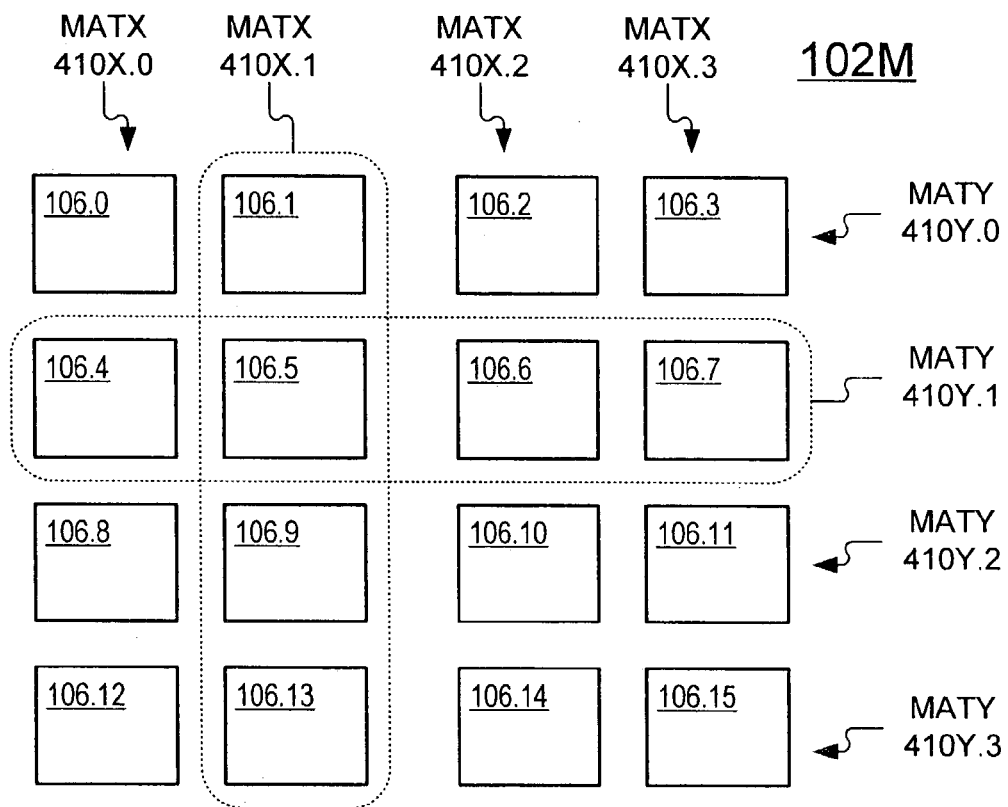

As shown in FIGS. 3A and 4, the sectors 106 are arranged as a matrix of four rows and four columns. We will call each column of sectors a MATX structure. The mat has four MATX structures 410X.0 through 410X.3. Each row of sectors will be called a MATY structure. The mat has four MATY structures 410Y.0 through 410Y.3.

As shown in FIG. 3A, global bitlines (GBL) 170G run vertically through mat 102M. Each GBL runs through the four sectors 106 of one MATX structure 410X. A number of GBLs 170G may run through each MATX structure. Each GBL 170G corresponds to a number of bitlines 170 in each of the four corresponding sectors 106. For illustration, we will assume that each GBL 170G corresponds to four BLs 170 in each of the four corresponding sectors, and 256 GBLs run through each MATX structure 410X.

Global Y multiplexer 420 connects selected global bitlines 170G to sense amplifiers 422. The sense amplifiers sense the bitline voltages during reading. During programming, global Y multiplexer 420 drives global bitlines 170G with voltages shown in Table 1 for bitlines 170. Global Y multiplexer 420 selects the global bitlines based on signals provided by Y decoder 424. Y decoder 424 selects a global bitline or bitlines based on address signals ADDR. Multiple global bitlines can be selected at a time. In the embodiment being described, the memory has 16 input/output terminals, so 16 bitlines are selected at the same time in read, program, and program-verify operations. The 16 bitlines are selected by selecting 16 GBLs 170G and selecting one bitline 170 for each of the selected GBLs. In one embodiment, the 16 GBLs are selected in a single MATX 410X.

Bitlines 170 are selected by local Y multiplexers 430. In FIG. 3A, each MUX 430 is shown below the corresponding sector 106. In some embodiments, each MUX 430 has a portion below the corresponding sector 106 and a portion above the sector 106. Each local Y multiplexer 430 receives pre-decoded address signals (not shown) from the corresponding local Y decoder 432 (FIG. 3B). Based on these address signals, local Y multiplexer 430 connects each bitline BL 170 in the corresponding sector 106 to the corresponding GBL 170G or to the "non-selected" voltage (Table 1).

Global bitlines 170G are connected to a global bit line pull-up driver (not shown) that provides the program inhibit voltage Vcc to the non-selected bitlines during the program operation. This driver is located at the top of the mat in the view of FIG. 3A.

Global X decoder 438 drives wordlines 150. Each WL 150 extends through the four sectors of one MATY structure 410Y. In some embodiments, each polysilicon wordline 150 extends through only sector 106, but the wordlines are connected to overlying metal strap lines, and each strap line extends through the MATY structure. Each strap line is permanently connected to one wordline 150 in each of the four sectors 106 of the MATX structure.

Global X decoder 438 selects the wordlines based on the address signals ADDR and operation signals OP specifying the operation to be performed (read, program, erase, program verify, or erase verify). The wordline decoding is not hierarchical in this embodiment, i.e. there are no local wordline decoders for the individual sectors like for the bitlines. Other embodiments use hierarchical wordline decoding.

The control gate and source line decoding is hierarchical in this embodiment. Each secondary CG & SL decoder 440 is located between two corresponding sectors 106. One of the two sectors 106 is on the right hand side of the decodes, and the other sector is on the left. Decoder 440 provides local CG and SL decoding for the two sectors.

Global X decoder 438 generates select signals (selX) 450 for the secondary decoders 440. Each selX line 450 traverses one MATY structure 410Y, and is connected to inputs of two corresponding secondary decoders 440 in the MATY structure.

Vertical repeater decoder 454 provides the control gate and source line voltages (Table 1) to secondary decoders 440. The voltages are carried by lines 460 that run vertically through mat 102M. Each line 460 is connected to up to four corresponding secondary decoders 440 located between two MATX structures. The voltages for lines 460 are selected by decoder 454 based on the address signals ADDR and operation signal OP.

Sector decoder 462 provides voltages for biasing the P wells 124. Each sector 106 is fabricated in and over a separate P well 124. Sector decoder 462 receives address and operation signals ADDR, OP and provides the sector bias voltages on lines 464. Lines 464 run vertically to the corresponding sectors.

During programming and erase operations, lines 460 and/or 464 carry super high voltages generated by charge pumps 470. "Super high voltages" are voltages outside of the range of voltages suitable for reading. For the example, suppose the reading voltages are all in the range from Vss to Vcc, where Vss is a reference voltage (e.g. ground), and Vcc is a power supply voltage (received from an external power supply or generated internally). Then a super high voltage is any voltage outside of this range. For instance, if Vss=0V and Vcc=3.0V, then a super high voltage is any voltage above 3.0V or any negative voltage. In the embodiment being described, Vcc is assumed to be 2.7V to 3.6V, but other Vcc values scan also be used, and further the memory can be powered by multiple power supply voltages. Super high voltages can be generated from Vcc and/or Vss by on-chip charge pumps 470, or can be received from off-chip voltage sources.

The voltages in the reading range (e.g. from Vss to Vcc) will be called "low voltages".

Wordlines 150 and the corresponding strap lines (not shown), as well as the selX lines 450, extend horizontally and do not carry super high voltages. Because the super high voltages are carried by the lines that extend vertically, the capacitance associated with wordlines 150, control gate lines 140, and source lines 152 is reduced. The noise injection into these lines is also reduced. The parasitic capacitance associated with the super high voltage lines is reduced also.

Hierarchical bitline decoding reduces the area occupied by the lines that carry address and OP information from global Y mux 420 to sectors 106 because these lines select a group of four bitlines 170 (corresponding to one GBL 170G), not an individual bitline. The individual bitlines are selected by the local Y multiplexers 430. Also, the capacitance associated with each bitline 170 is reduced. Likewise, the hierarchical decoding of control gate lines 140 and source lines 152 reduces the area occupied by the lines that carry the address and OP information from global X decoder to sectors 106 and reduces the capacitance associated with individual CGLs 140 and SLs 152. For each pair of sectors 106, the corresponding secondary decoding circuits for CGL lines 140 and SL lines 152 share a common area (the area occupied by a decoder 440). Therefore, the total memory area is reduced. Of note, there must be a minimum spacing X (FIG. 1) between each P well 124 and the peripheral circuitry 120. The minimum spacing is needed to prevent the depletion layers in a sector 106 from interfering with the peripheral circuitry, and also to prevent the depletion layers formed in the peripheral circuitry from interfering with the memory cells. The minimum spacing X is larger in those embodiments in which the P wells 124 can carry super high voltages (e.g. when the sectors 106 are erased through the P well). Since the secondary CGL and SL decoders 440 share a common area, only one X spacing is required between each sector 106 and the corresponding CGL and SL decoding circuitry.

Also, in some embodiments, the CGL and SL transistors in decoders 440 can share wells in substrate 104. This is particularly desirable since high voltage transistors (transistors exposed to super high voltages) may need separate wells. For example, FIG. 1 shows PMOS transistor 178 having source/drain regions 184 formed in N well 186. The low voltage PMOS transistors' N wells can be biased at Vcc, but Vcc may be inappropriate for biasing a high voltage PMOS transistor N well. If the PMOS source/drain regions 184 carry a super high positive voltage (e.g. 6.0V or 10V), the corresponding N well bias voltage is at least as high as this super high voltage. As seen in Table 1, both the control gates 140 and the source lines 152 can carry super high positive voltages, so the corresponding PMOS transistors could share the N wells 186. This is not done in the embodiment being described, however.

Now some features of an exemplary embodiment will be described in more detail. We will assume that the memory is erased through the substrate (i.e. through P well 124 but not through SL regions 152 or BL regions 160). In peripheral circuitry 120, the low voltage transistor threshold voltages are between 0.6V and 0.7V for the NMOS transistors and between −0.9V and −0.8V for the PMOS transistors. The high voltage transistor threshold voltages are between 0.7V and 0.8V for the NMOS transistors and between −0.9V and −0.8V for the PMOS transistors.

We will assume that each array 106 (FIG. 2) is divided into pages. Each page contains four rows (rows 0 through 3 form page 1, rows 4–7 form page 2, etc.). In each page, the source lines 152 are tied together (permanently connected together). The control gate lines 140 are tied together in groups of four, but not in the same page. Control gate lines 140 in rows 0, 4, 8, 12 are tied together, the control gate lines in rows 1, 5, 9, 13 are tied together, and so on. Such architecture is described in the aforementioned U.S. patent application Ser. No. 09/972,388. This architecture is not limiting.

Figure 5:
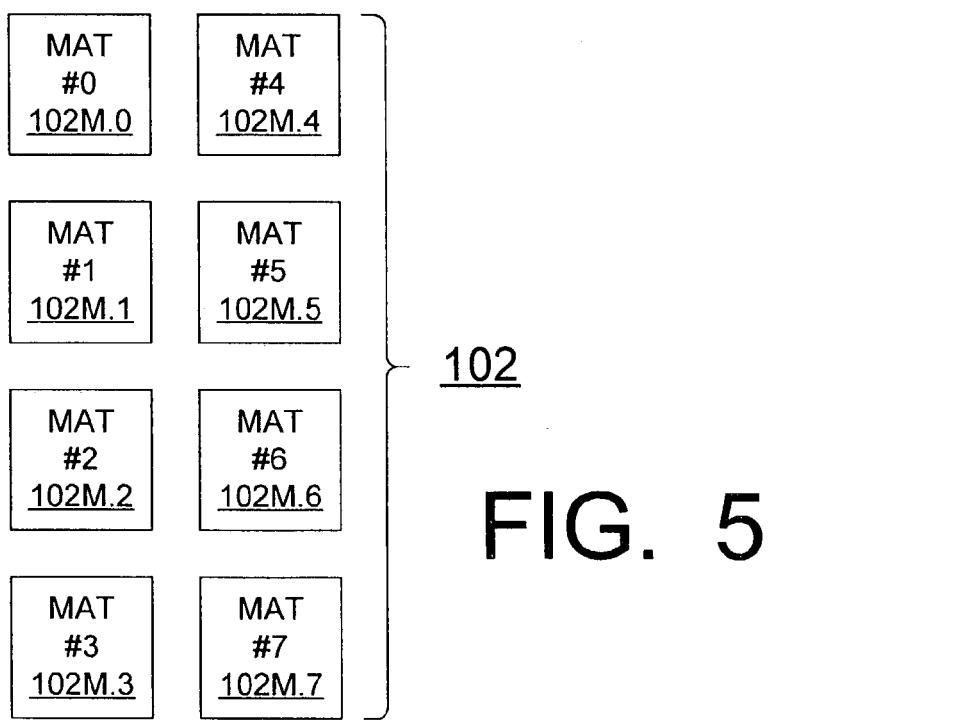

We will assume that the memory contains eight mats 102M, shown as 102M.0 to 102M.7 in FIG. 5. These parameters are illustrative and not limiting.

Figures 6, 7:
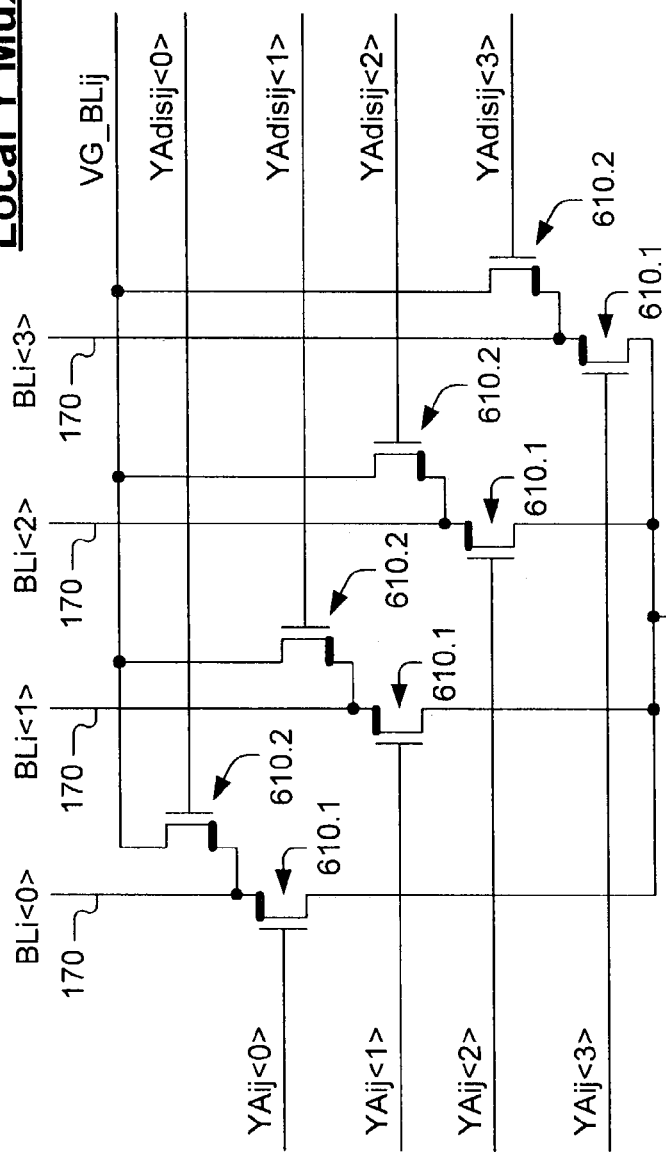
FIG. 6 is a circuit diagram of a portion of the memory of FIG. 1.
FIG. 7 is a table of exemplary voltages for the circuit of FIG. 6.

FIG. 6 is a circuit diagram illustrating a portion of local Y multiplexer 430. The circuit of FIG. 6 drives four bitlines 170, shown as Bli<0> through Bli<3>, corresponding to a single global bitline GBLi<j>. FIG. 7 is a table illustrating the voltage levels of some signals. The circuit diagram, the voltage levels, and other particulars are for the purpose of illustration and not to limit the invention.

Figures 30, 31:
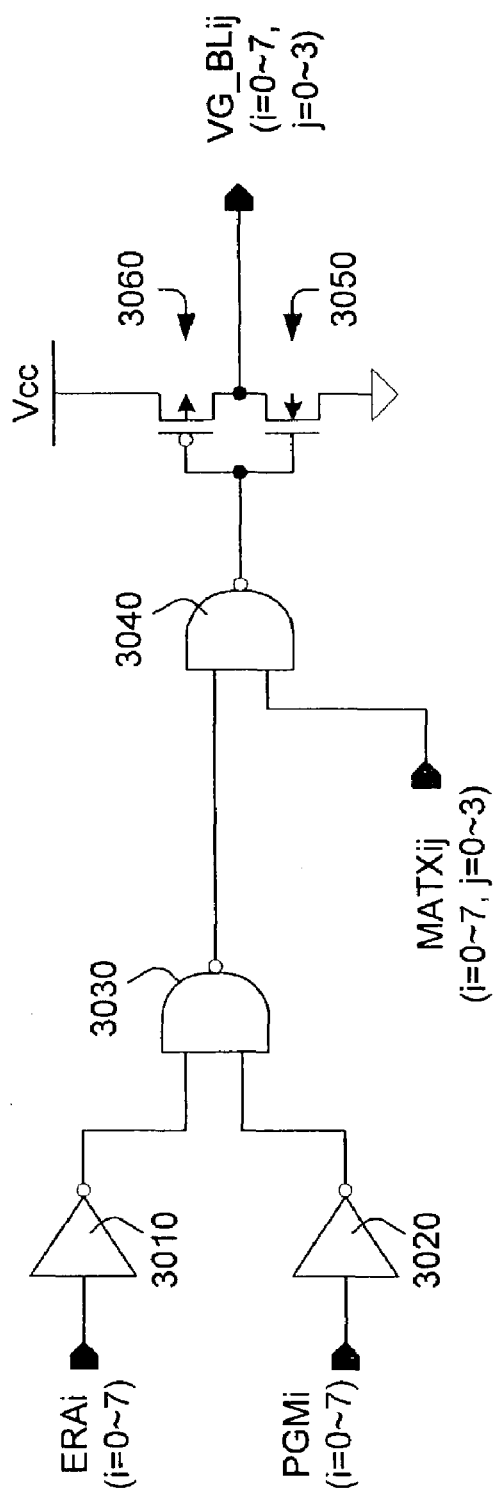
FIG. 30 is a circuit diagram of a portion of the memory of FIG. 1.
FIG. 31 is a table of exemplary voltages for the circuit of FIG. 30.

Each bitline BLi is driven by two corresponding NMOS transistors 610.1, 610.2. The bitline BLi is connected to one source/drain region of each of the two transistors. The other source/drain region of transistor 610.1 is connected to the corresponding global bitline 170G. The other source/drain region of transistor 610.2 is connected to a line VG_BLij. Signal VG_BLij is generated from the OP signals, as shown in FIG. 7. The circuit generating the signal VG_BLij is shown in FIGS. 30, 31 and described below.

The gates of transistors 610.1 for bitlines BLi<0> through BLi<3> receive respective signals YAij<0> through YAij<3>, and the gates of transistors 610.2 receive respective signals YAdisij<0> through YAdisij<3>. Signals YAij, YAdisij are generated by local Y decoders 432 (FIG. 3B) from the ADDR an OP signals as shown in FIG. 7. In FIG. 7, "Sel" means the corresponding bitline is selected by the address signals. "Unsel" means the bitline is not selected. For example, if the address signals select the bitline BLi<1> in a read operation, then YAij<1> is at Vcc, the remaining YAij signals are at 0V, YAdisij<1> is 0V, the remaining YAdisij signals are at Vcc, and GBLi<j> is about 1.0V.

Figure 8:
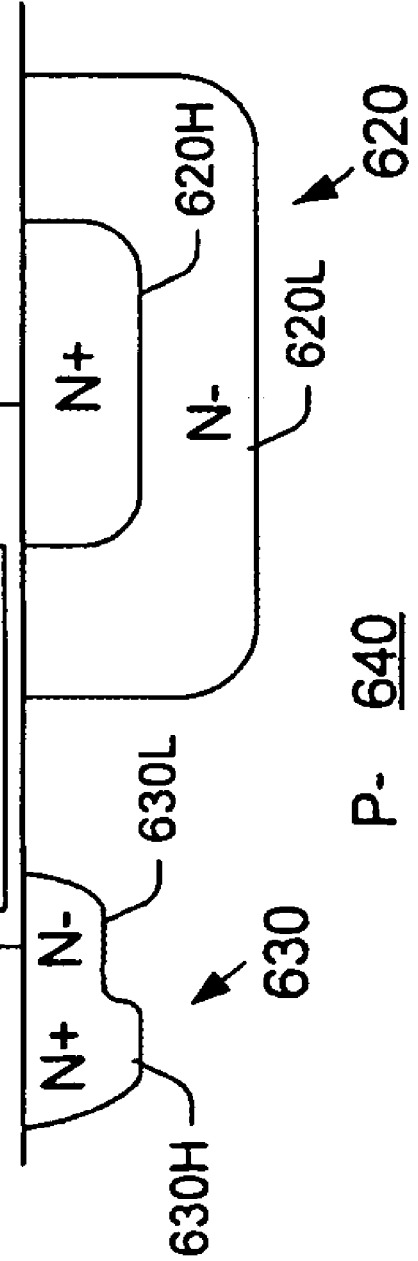
FIG. 8 is a cross section illustration of a portion of the circuit of FIG. 6.

FIG. 8 shows a cross section of one transistor 610 (transistor 610.1 or 610.2). The transistor has a gate 614, a source/drain region 620 connected to the respective bitline BLi, and a source/drain region 630 connected to GBL 170G or VG_BLij. Regions 620, 630 are doped regions formed in a P type region 640 (doped P−) of substrate 104. The voltages on lines GBL 170G and VG_BLij are at most Vcc. The voltages on bitlines 170 can exceed Vcc during the erase operation. Transistors 610 are disabled (turned off) during the erase by a ground voltage on their gates 614, as shown in FIG. 7. Therefore, the bitline voltage does not propagate to source/drain regions 630. Source/drain regions 620 are made to have a higher junction breakdown voltage than regions 630. In some embodiments, the regions 620 are formed by the well known DDD (double diffused drain) method. Each region 620 includes a lower doped (N−) sub-region 620L which abuts the channel region, and a higher doped (N+) region 620H enclosed in region 620L, as known in the art. Each region 630 is an LDD (lightly doped drain) region having a lower doped (N−) sub-region 630L abutting the channel, and a higher doped (N+) sub-region 630H spaced from the channel. Source/drain 620 has a higher junction breakdown voltage because the source/drain 620 is doped N− in the junction area adjacent to P type region 640 (the N+ region 620H does not have a junction with region 640). LDD region 630 has a lower junction breakdown voltage because its N+ sub-region 630H has a junction with P type region 640. In one embodiment, the junction breakdown voltage of region 620 is 12V and the junction breakdown voltage of region 630 is 7V.

Source/drain region 630 is more shallow. In one embodiment, its depth is 0.1 μm, and the depth of region 620 is 0.2 μm to 0.25 μm. The lateral area of region 630 is smaller because the dopant does not diffuse laterally as much as the dopant in region 620. Also, the transistor gate 614 can be made shorter because the region 630 does not diffuse laterally into the channel region under the gate as much as the region 620. Therefore, the memory size is reduced.

Other techniques, known or to be invented, can be used to achieve the higher breakdown voltage in region 620.

In some embodiments, transistors 610 have shorter channel lengths than other high voltage peripheral transistors in the integrated circuit (e.g. a 0.51 μm channel length for transistors 610 versus a 1 μm channel length for other high voltage peripheral transistors). The shorter channel lengths increase the transistor speed.

In the subsequent drawings, transistors that can handle high voltages ("high voltage transistors") are shown in thicker lines. In some embodiments, these transistors have deeper junctions and a thicker gate oxide than the low voltage transistors.

Figures 9, 10:
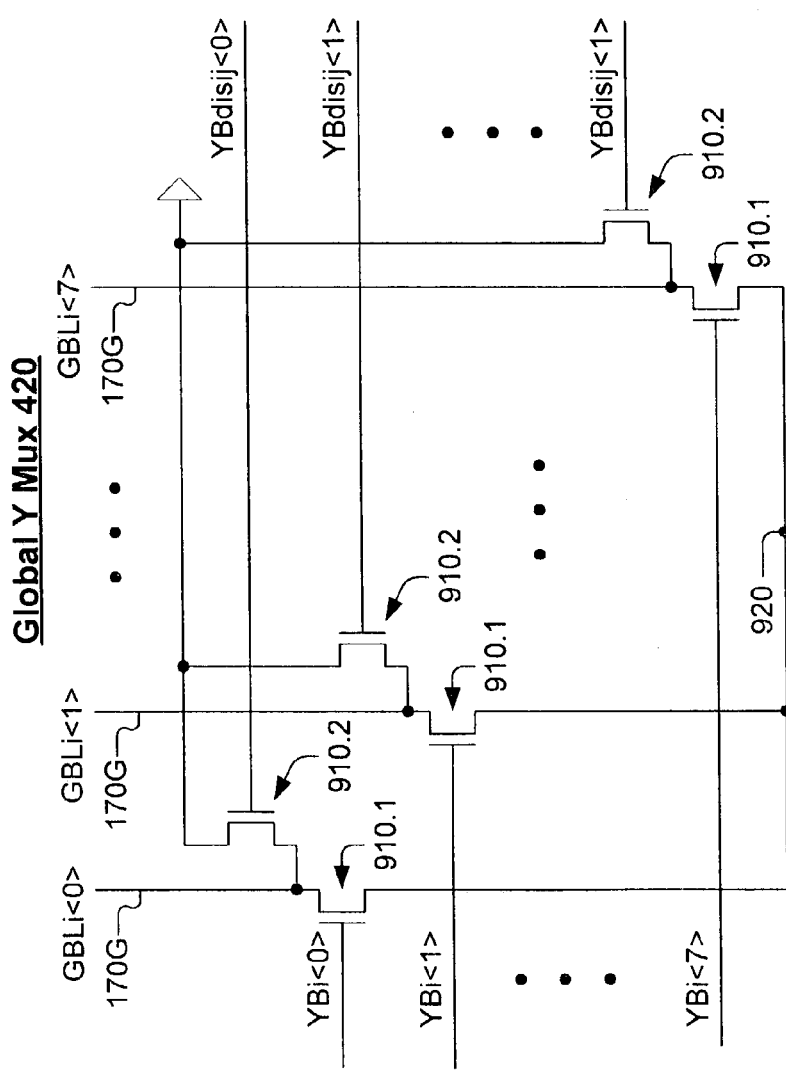
FIG. 9 is a circuit diagram of a portion of the memory of FIG. 1.
FIG. 10 is a table of exemplary voltages for the circuit of FIG. 9.

FIG. 9 is a circuit diagram of a portion of global Y multiplexer 420. This portion drives eight global bitlines 170G, marked GBLi<0> through GBLi<7>, for one MATX structure 410X (FIG. 4). In this embodiment, each MATX structure has 16 GBLs for each input/output terminal of the memory. The circuit of FIG. 9 drives eight out of the 16 GBLs corresponding to one input/out terminal. The other eight GBLs are driven by an identical circuit. The 16 GBLs correspond to one data line DLij. Each data line DLij corresponds to one input/output terminal. Lines DLij are connected to sense amplifiers 422.

The voltages involved are shown in FIG. 10. "Sel" means the corresponding global bitline is selected by the address signals (i.e. the global bitline corresponds to a bitline 170 selected by the address signals). "Unsel" means the global bitline is not selected.

Each global bitline GBL corresponds to two NMOS transistors 910.1, 910.2. The global bitline is connected to one source/drain region of each of the two transistors. The other source/drain regions of transistor 910.1 is connected to a terminal 920. The other source/drain region of transistor 910.2 is grounded. Terminal 920 is a source/drain terminal of an NMOS transistor 930. The other source/drain terminal of transistor 930 is connected to data line DLij. The gate of transistor 930 receives a signal YCijk shown in FIG. 10. Index i (0 to 7) is the index of MAT 102M (FIG. 5). Index j (0 to 3) is the index of MATX 410X within the MAT. Index k (0 or 1) is the index of transistor 930—there are two transistors 930 for the corresponding two groups of eight GBLs corresponding to the I/O terminal.

The gates of transistors 910.1 for global bitlines GBLi<0> through GBLi<7> receive respective signals YBij<0> through YBij<7>. The gates of transistors 910.2 for global bitlines GBLi<0>, GBLi<2>, GBLi<4>, GBLi<6> receive the signal YBdisij<0>. The gates of transistors 910.2 for global bitlines GBLi<1>, GBLi<3>, GBLi<5>, GBLi<7> receive the signal YBdisij<1>. Signals YBij, YBdisij, YCijk are generated by global Y decoder 424 from the address signals as shown in FIG. 10. Signal YCijk is at the "Sel" voltage if, and only if, one of the corresponding global bitlines GBLi<0>, . . . GBLi<7> is selected. If a global bitline is selected, the corresponding signals YBij, YBdisij (i.e. the signals connected to the gates of the corresponding transistors 910.1, 910.2) are at the "sel" voltages. Otherwise the corresponding signals are at the "unsel" voltages.

Figure 13:
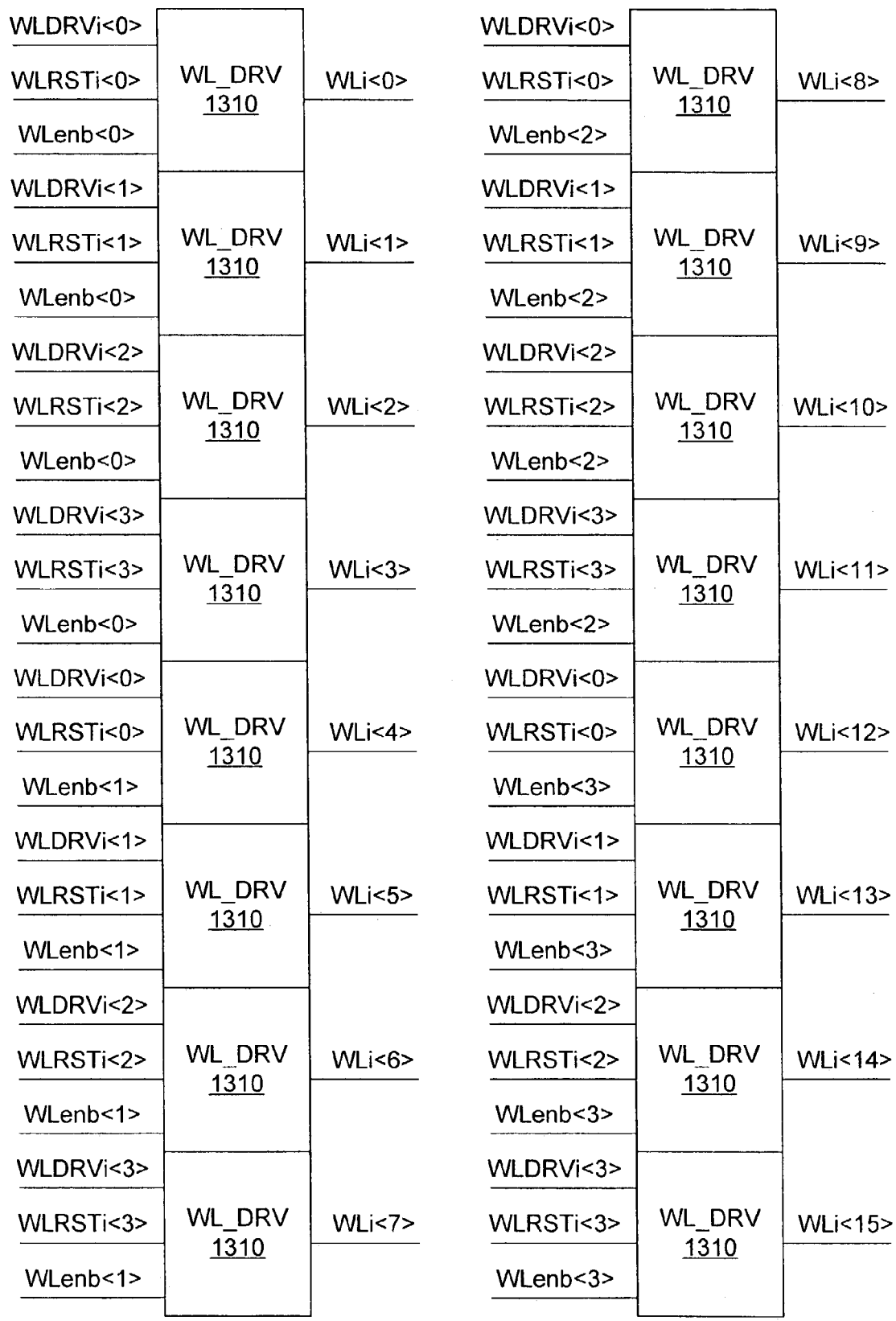
FIG. 13 is a block diagram of a portion of the memory of FIG. 1.
Figure 14:
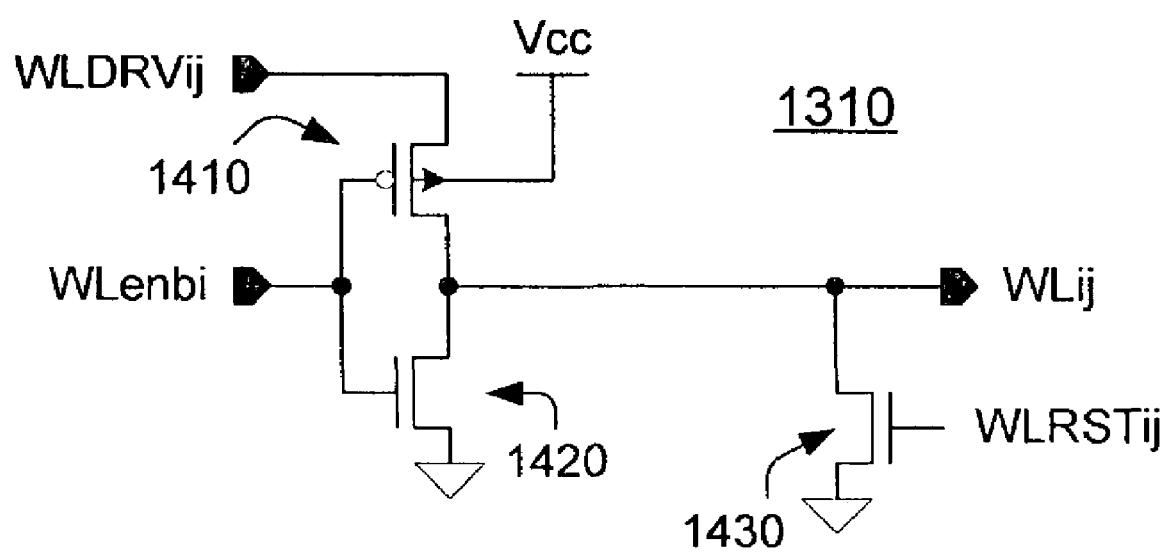

FIGS. 11–14 show a portion of global X decoder 438 to drive a group of 16 wordlines 150 for one MATX structure. FIGS. 11, 13, 14 are circuit and block diagrams. FIG. 12 is a table showing the voltage levels of some signals. All of the circuitry uses voltages in the range from 0V to Vcc.

FIG. 11 shows one of 32 identical blocks provided for each MATX 410X. Each of signals Pij, Qij, XENij, Si<0> through Si<3>, WLDRVi, WLRSTi is a function of the ADDR and OP signals, as shown in FIG. 12. The OP signals determine the current operation, and thus correspond to the column headings "Read, PGM, Erase, Verify" in FIG. 12. "Verify" means program verify unless stated otherwise.

Signals Pij (i=0~7, j=0~7), Qij (i=0~7, j=0~3) are decoded address signals which together select one of the 32 blocks such as the block of FIG. 11. Index i determines the MAT 102M. In FIG. 12, the "Addr" column indicates whether the corresponding block is selected ("Sel") or not selected ("Unsel") by the address signals. Signal XENij encodes the MATY information.

In the figures, use of brackets is optional, for example WLenb<i> is the same signal as WLenbi. The tilde "~" denotes a range. For example, "i=0~7" means that i can take the values 0, 1, 2, 3, 4, 5, 6, 7.

As shown in FIG. 11, the signals Pij, Qij, XENij are provided to respective inputs of a three-input NAND gate 1110. The output GCGbij of NAND gate 1110 is one of the preX signals delivered to the corresponding secondary CG and SL decoder 440 (FIG. 3A). Signals GCGbij and GERAbij are NANDed by NAND gate 1120. The output GCGij of gate 1120 is another preX signal provided to the corresponding decoder 440. (Since GCGij and GCGbij are inverses of each other, in some embodiments only one of the two signals is provided to the decoder 440, and the other one of the two signals is generated by the decoder.) Signal GCGij is provided to one input of each two-input NAND gate 1130.0 through 1130.3. The other input of each gate 1130.j (j=0~3) receives the signal Si<j>. The four NAND gates 1130 provide respective enable signals WLenb<0> through WLenb<3>.

As shown in FIG. 13, the global X decoder has 16 identical WL_DRV blocks 1310 each of which drives a respective wordline WLi. Each block receives one WLDRVij signal, one WLRSTij signal, and one WLEnbi signal. A circuit diagram of one WL_DRV block 1310 is shown in FIG. 14. PMOS transistor 1410 receives on its source terminal the signal WLDRVij. The drain of transistor 1410 is connected to the drain of NMOS transistor 1420. The source of transistor 1420 is grounded. The gates of transistors 1410, 1420 receive the signal WLenbi. The drains of transistors 1410, 1420 are connected to the wordline WLij (more precisely, the drains are connected to the corresponding strap line WL_S; see FIG. 3A). Wordline WLij (or the corresponding strap line) is connected to the drain of NMOS transistor 1430. The source of transistor 1430 is connected to the ground terminal. The gate receives the signal WLRSTij.

FIGS. 15A, 15B, 15C illustrate a circuit block forming a part of vertical repeater decoder 454. FIG. 16 shows voltage levels of some of the signals. There is one such block for each MATX structure (FIG. 4). In these figures, index i is the MAT index (i=0~7), corresponding to MAT 102M.i (FIG. 5). Index j is the MATX index (j=0~3), corresponding to MATX 410X.j (FIG. 4) in MAT 102M.i.

The circuit of FIG. 15A generates a signal Vpmatxij for the secondary decoders 440 for MATX structure 410X.j of mat 102M.i. In FIG. 16, in the MAT column, "Same" indicates the mat 102M.i is selected by the address signals, "Others" means the mat 102M.i is not selected. In the MATX column, "Sel" means the MATX structure 410X.j in mat 102M.i is selected, "Unsel" means the MATX structure is not selected.

Terminal Vpcg is connected to terminal Vpmatxij through high voltage NMOS transistor 1510 and, separately, through serially connected high voltage PMOS transistors 1514, 1516. Terminal Vpcg is connected to a source/drain region and the body region of transistor 1514. The other source/drain region of transistor 1514 is connected to a source/drain region of transistor 1516. The other source/drain region of transistor 1516, and the body region of the transistor, are connected to terminal Vpmatxij.

The gate of transistor 1510 receives a signal Vpcg_pass generated by the circuit of FIG. 15B.

Terminal Vpcg is connected to the source and body regions of high voltage PMOS transistors 1520, 1522. The drain regions of transistors 1520, 1522 are connected respectively to the drain regions of high voltage NMOS transistors 1524, 1526. The source regions of transistors 1524, 1526 are at ground. The gates of transistors 1524, 1526 receive respective signals Vpcg_passb, Vpcg_pass. Signal Vpcg_passb (the inverse of Vpcg_pass) is generated by the circuit of FIG. 15B.

The gate of transistor 1520 is connected to the drain of transistor 1522 and to the gate of transistor 1514. The gate of transistor 1522 is connected to the drain of transistor 1520.

High voltage PMOS transistors 1530, 1532 and high voltage NMOS transistors 1534, 1536 form the same circuit as respective transistors 1520, 1522, 1524, 1526. The source and body regions of transistors 1530, 1532 are connected to terminal Vpmatxij. The drain of transistor 1532 is connected to the gate of transistor 1516.

Signal Vpcg_pass and signal Vpcerai (which is generated by the circuit of FIG. 15C) are ORed by the combination of NOR gate 1540 and inverter 1542. The OR signal is provided to the gate of PMOS transistor 1544. Circuits 1540, 1542 and transistor 1544 are low voltage devices. The circuits and signals of FIGS. 15B, 15C are low voltage.

The source and body regions of transistor 1544 are at Vcc. The drain of transistor 1544 is connected to the source of high voltage PMOS transistor 1546. The gate of transistor 1540 is connected to the drain of transistor 1530. The drain and body regions of transistor 1546 are connected to the drain of high voltage NMOS transistor 1548. The source of transistor 1548 is at ground. The gate receives signal Vpcerai.

In FIG. 15B, signal Vpcg_passb is generated by inverter 1550 and NAND gate 1552 to be the inverse of (MATXij AND NOT Vpcselbi). Signal MATXij is active (Vcc) when MATX 410X.j in MAT 102M.i is selected by the address signals. Signal Vpcselbi is at 0V during program, program-verify, and erase-verify operations on MAT 102M.i. Vpcselbi is Vcc at all other times. Signal Vpc_pass is the inverse of Vpc_passb generated by inverter 1554.

As shown in FIG. 15C, signal Vpcerai is an AND of MATXij and ERAi generated by NAND gate 1556 and inverter 1558. ERAi is the erase master signal for MAT 102M.i. ERAi is active (Vcc) for the erase operations on the MAT, and is 0V otherwise. ERAi is one of the OP signals shown in FIGS. 3A, 3B.

FIGS. 17, 18 illustrate a circuit that generates signals Vpcmatxijk in vertical repeater decoder 454. These signals will provide the CGL voltage levels to secondary decoders 440. As in FIGS. 15A–15C, index i is the MAT index, and index j is the MATX index. For each MATX structure, four Vpcmatxijk signals are generated for four respective CGL lines in one page (FIG. 2). Index k=0~3 is the index of the CGL line.

There is a separate copy of the circuit of FIG. 17 for each combination of indices (i, j, k).

In FIG. 18, in the MATX column, "Same" means the MATX 410X.i is selected. "Others" means the MATX is not selected. In the Addr column, "Sel" means the control gate line "k" is selected by the address signals. "Unsel" means the control gate line is not selected.

Terminal Vpmatxij is connected to the source and body regions of high voltage PMOS transistors 1710, 1712. The drain regions of transistors 1710, 1712 are connected respectively to the drain regions of high voltage NMOS transistors 1714, 1716 whose sources are grounded. The gate of transistor 1712 is connected to the drain of transistor 1710. The gate of transistor 1710 is connected to the drain of transistor 1712.

Terminal Vpmatxij is connected to the source and body regions of high voltage PMOS transistor 1720 whose gate is connected to the drain of transistor 1712. The drain of transistor 1720 is connected to terminal Vpcmatxijk. High voltage NMOS transistor 1722 is connected between the terminals Vpmatxij, Vpcmatxijk in parallel with transistor 1720. High voltage NMOS transistor 1724 is connected between the terminal Vpcmatxijk and ground.

Signals LAXi<7>, LAXi<8> are NANDed by NAND gate 1742. Signals LAXi<7>, LAXi<8> are two out of 19 local address bits LAXi (i is the MAT index).

The output of gate 1742 is inverted by inverter 1744. The output of inverter 1744 is NANDed with signal MATXij by NAND gate 1746. The output of gate 1746 is ORed with signal Vpcselbi by NOR gate 1748 and inverter 1750. The output of inverter 1750 is connected to the gates of transistors 1716, 1722 and the input of inverter 1752. The output of inverter 1752 is connected to the gates of transistors 1714, 1724.

Signals LAXi<7:8>, MATXij, Vpcselbi are low voltage signals. Logic devices 1742–1752 are low voltage devices.

If the output of inverter 1750 is low, terminal Vpcmatxijk is grounded through transistor 1724. If the output of inverter 1750 is high, transistors 1720, 1722 connect the terminal Vpcmatxijk to terminal Vpmatxij.

Figures 19, 20:
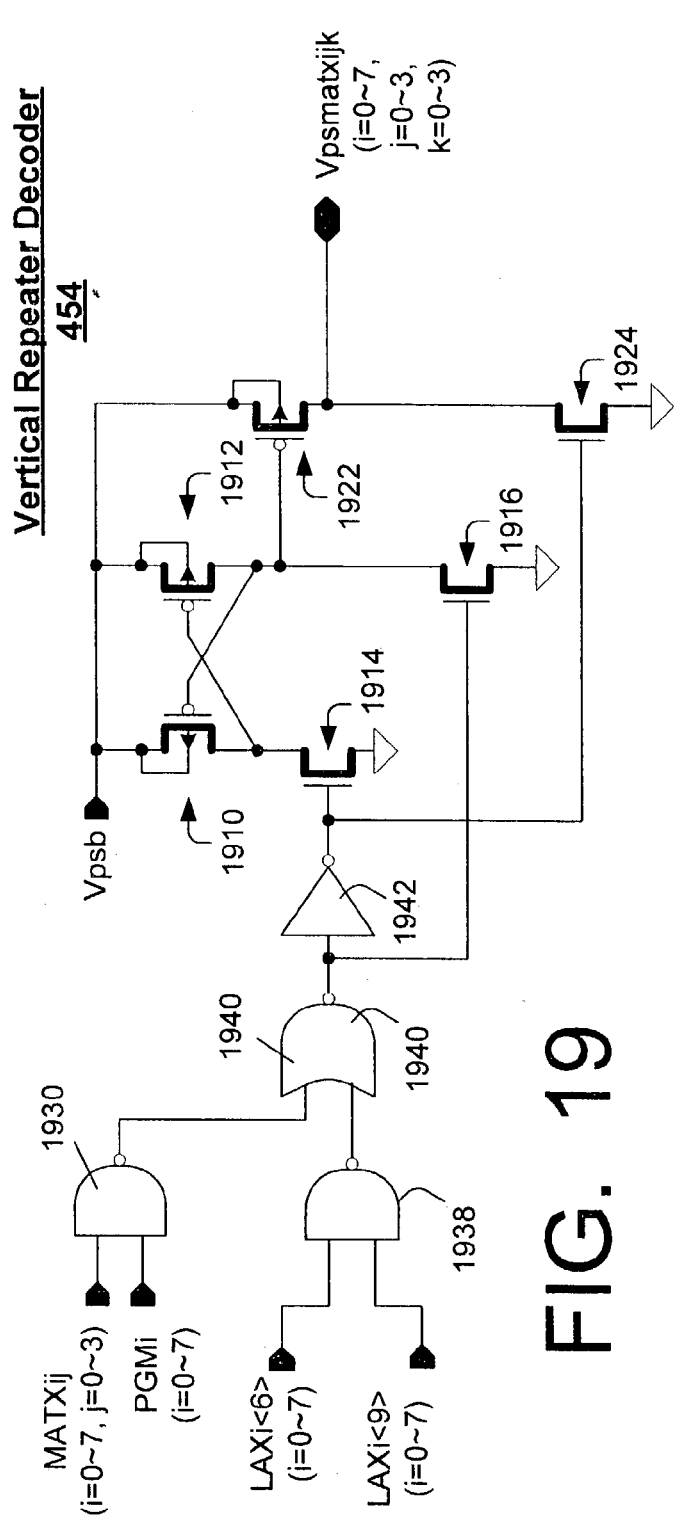
FIG. 19 is a circuit diagram of a portion of the memory of FIG. 1.
FIG. 20 is a table of exemplary voltages for the circuit of FIG. 19.

FIGS. 19, 20 illustrate a circuit that generates signals Vpsmatxijk in vertical repeater decoder 454. These signals will provide the SL voltage levels to secondary decoders 440. As in FIGS. 17, 18, index i is the MAT index, index j is the MATX index. For each MATX structure, four Vpsmatxijk signals are generated for four respective SL lines. Index k=0~3 is the index of the SL line. In this embodiment, adjacent rows share the SL lines, and four adjacent rows have their SL lines permanently tied together.

There is a separate copy of the circuit of FIG. 19 for each combination of indices (i, j, k).

High voltage PMOS transistors 1910, 1912, 1922 and high voltage NMOS transistors 1914, 1916, 1924 are connected between terminals Vpsb, Vpsmatxijk, and ground in the same configuration as the respective transistors 1710, 1712, 1722, 1714, 1716, 1924 connected between the respective terminals Vpsmatxij, Vpcmatxijk, and ground.

NAND gate 1930 computes a NAND of signals MATXij, PGMi. Signal PGMi (one of the OP signals) is a program master signal for MAT 102M.i (PGMi is Vcc during programming in the MAT, 0V otherwise). PGMi is one of the OP signals of FIGS. 3A, 3B.

Signals LAXi<6>, LAXi<9> are NANDed by NAND gate 1938.

The outputs of gates 1930, 1938 are NORed by NOR gate 1940. The output of NOR gate 1940 is connected to the gate of transistor 1916. The output of gate 1940 is inverted by inverter 1942. The output of inverter 1942 is connected to the gates of transistors 1914, 1924.

The signals MATXij, PGMi, LAXi<6>, LAXi<9> are low voltage signals (0V or Vcc). The gates and inverters 1930–1942 are low voltages devices.

Figures 21, 22:
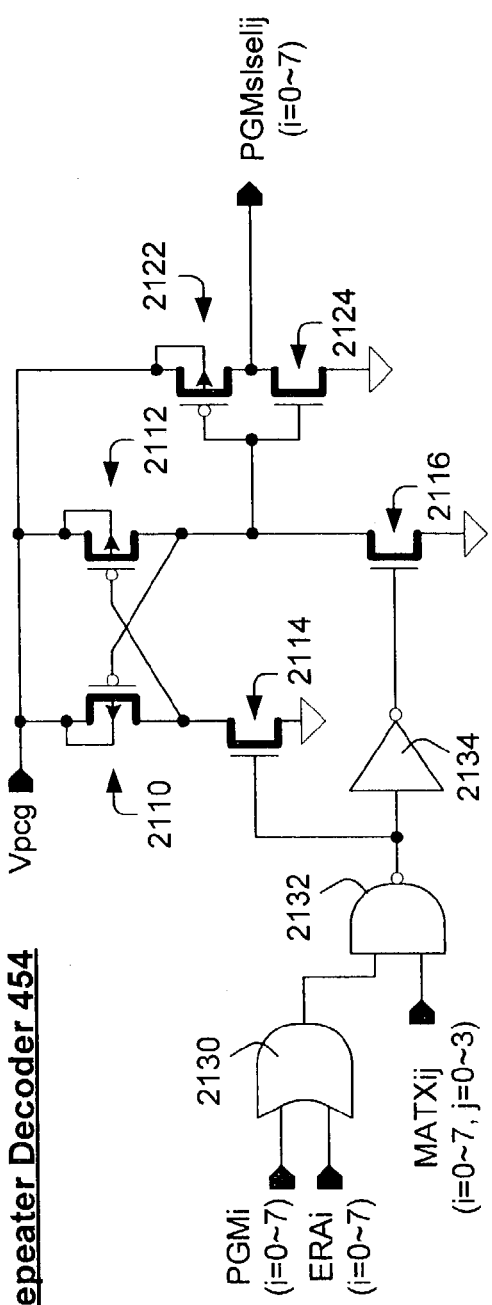
FIG. 21 is a circuit diagram of a portion of the memory of FIG. 1.
FIG. 22 is a table of exemplary voltages for the circuit of FIG. 21.

FIGS. 21, 22 illustrate generation of source line enable signals PGMslselij in vertical repeater decoder 454. These signals are provided to the secondary decoders 440. One copy of the circuit of FIG. 21 is provided for each mat 102M. In the figure, i is the mat index, and j is the MATX index within the mat.

High voltage PMOS transistors 2110, 2112, 2122 and high voltage NMOS transistors 2114, 2116, 2124 are connected between the terminals Vpsg, PGMslselij, and ground in the same configuration as the respective transistors 1910, 1912, 1922, 1914, 1916, 1924 connected between the respective terminals Vpsb, Vpsmatxijk, and ground.

Signals PGMi, ERAi are ORed by OR gate 2130. The output of gate 2130 is NANDed with signal MATXij by NAND gate 2134. The output of gate 2134 is connected to the gate of transistor 2114 and the input of inverter 2134. The output of inverter 2134 is connected to the gate of transistor 2116.

Signals PGMi, ERAi, MATXij are low voltage signals. Gates 2130, 2132 and inverter 2134 are low voltage devices.

FIG. 23 illustrates a circuit in vertical repeater decoder 454 to generate a signal Veci. This signal is a super high negative control gate voltage (−10V) for the erase operations. This signal is provided to the respective secondary decoders 440. One signal Veci is generated for the respective sector 106.i.

Input signal Vneg is −10V during an erase operation. See FIG. 24. Signal VNM detects the Vneg transitions as shown in the timing diagram of FIG. 25. VNM_DET is the inverse of VNM. VNM and VNM_DET are low voltage signals.

MATYij is active (Vcc) when MATY 410Y.j is selected by the address signals. MATYij is 0V otherwise.

Terminal VNM is connected to the source and body regions of high voltage PMOS transistors 2310, 2312. The drains of transistors 2310, 2312 are connected to the drain of high voltage NMOS transistor 2314. The source and body regions of transistor 2314 are connected to terminal Vneg. The gates of transistors 2312, 2314 are tied together.

High voltage PMOS transistors 2320, 2322 and high voltage NMOS transistor 2324 are connected between the terminals VNM, Vneg in the same configuration as the respective transistors 2310, 2312, 2314. The drain regions of transistors 2310, 2312, 2314 are connected to the gates of transistors 2322, 2324. The drain regions of transistors 2320, 2322, 2324 are connected to the gates of transistors 2312, 2314.

Terminal VNM is connected to the source and body regions of high voltage PMOS transistors 2330, 2332. Terminal Vneg is connected to the source and body regions of high voltage NMOS transistors 2334, 2336. The gates of transistors 2330, 2334 are connected to the drains of transistors 2320, 2322, 2324. The drains of transistors 2330, 2334 are connected to the gates of transistors 2332, 2336. The drains of transistors 2330, 2336 are connected to terminal Veci.

High voltage NMOS transistor 2340 is connected between terminal Veci and ground. The body region of transistor 2340 is connected to terminal Vneg. The gate of transistor 2340 is connected to the gates of transistors 2330, 2334.

Signals MATXij, MATYij are ANDed by AND gate 2350. The output of gate 2350 is NORed with signal VNM_DET by NOR gate 2352. The output of gate 2352 is connected to the gate of transistor 2310. The output of gate 2352 is NORed with signal VNM_DET by NOR gate 2354. The output of gate 2354 is connected to the gate of transistor 2320.

Gates 2350, 2352, 2354 are low voltage devices.

Figure 26B:
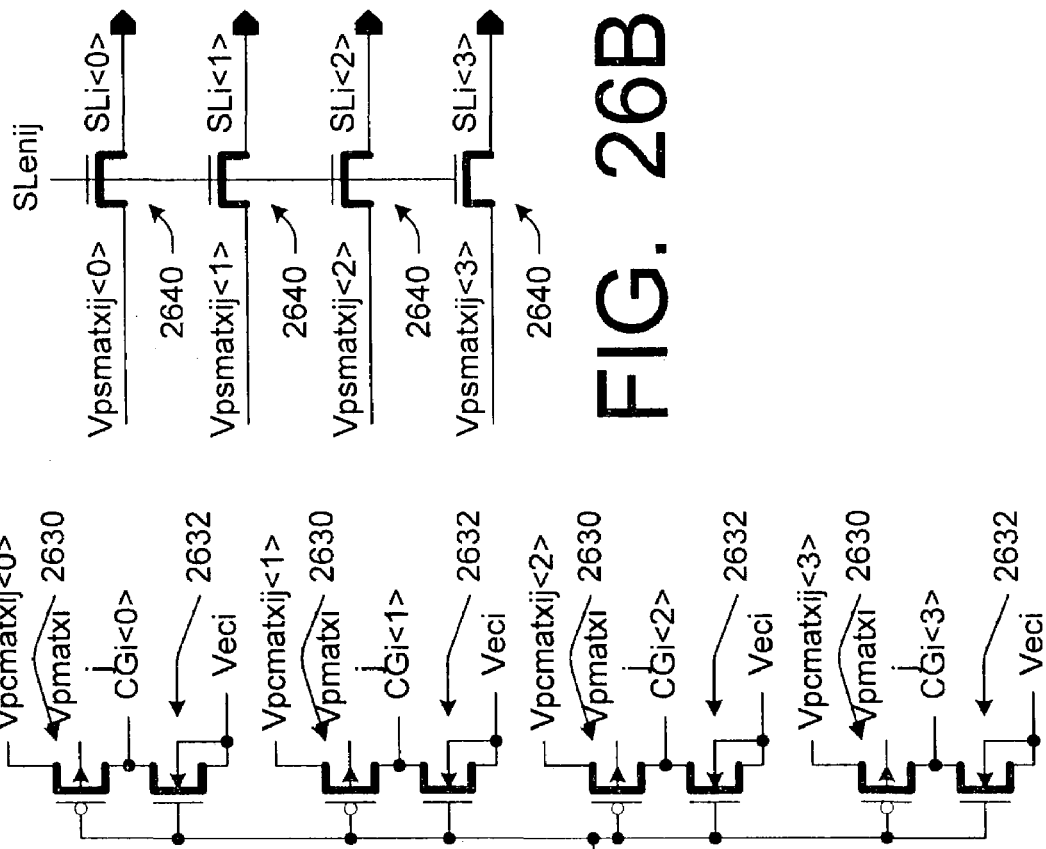
FIGS. 26A, 26B are circuit diagrams of portions of the memory of FIG. 1.
Figure 26A:
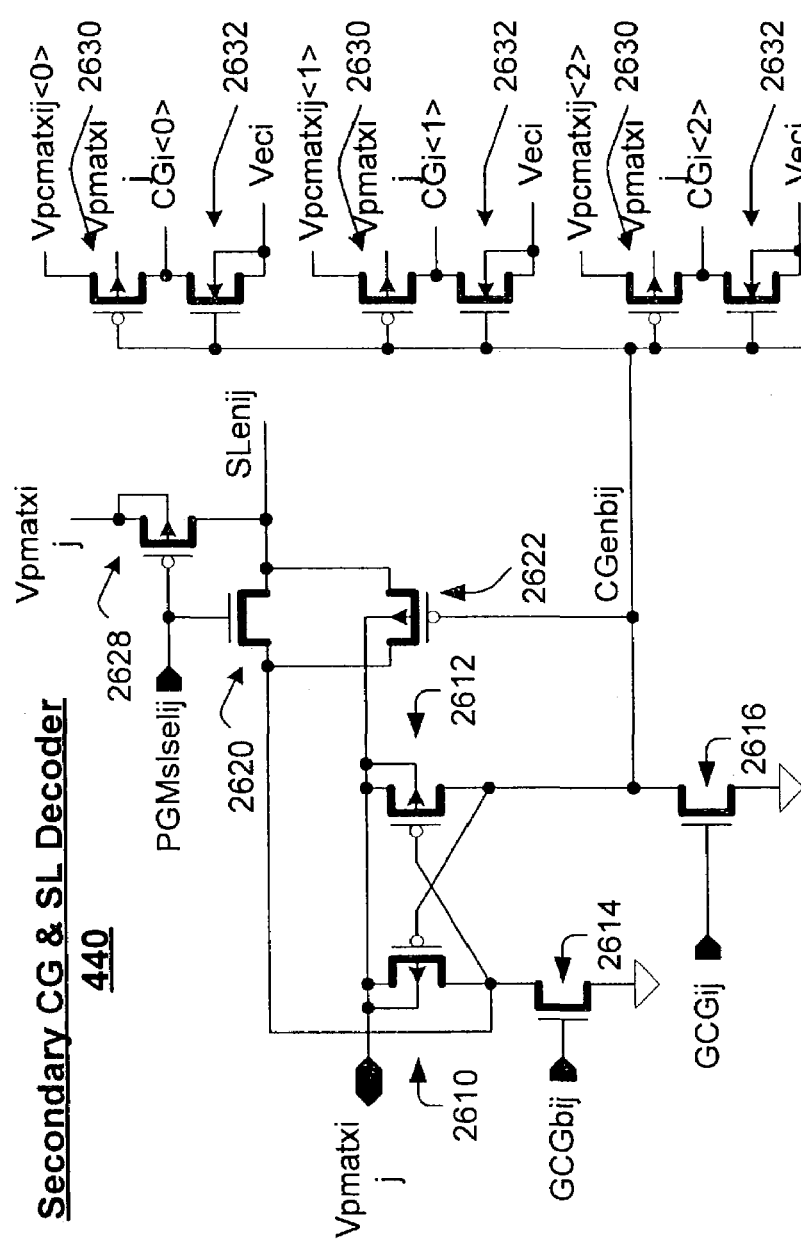

FIGS. 26A, 26B, 27 illustrate a circuit in a secondary CG and SL decoder 440. Each such circuit drives respective four control gate lines 140 shown as CGi<0> through CGi<3> and four source lines 152 shown as SLi<0> through SLi<3> for one sector 106. There are 512 rows in each sector. As mentioned above, control gate lines 140 are tied together in groups of four, and source lines 152 are tied together for four memory rows. Hence, each circuit of FIGS. 26A, 26B drives 16 control gate lines and 16 source lines. There are 32 such circuits for each sector.

In some embodiments, the secondary decoder 440 is connected to metal strap lines which in turn are connected to the control gate lines and the source lines.

In the input signal names in FIGS. 26A, 26B, index i is the mat index (corresponds to mat 102M.i). Index j is the MATX index (0~3), except in the signal names GCGij, GCGbij. In these signal names, index j corresponds to one of the 32 circuits provided for the sector, each circuit being identical to the one shown in FIGS. 26A, 26B.

Signal Vpmatxij (FIG. 15A) is connected to the source and body regions of high voltage PMOS transistors 2610, 2612. The drain regions of transistors 2610, 2612 are connected respectively to the drain regions of high voltage NMOS transistors 2614, 2616. The sources of the NMOS transistors are grounded. The gates of transistors 2614, 2616 receive respective complimentary signals GCGbij, GCGij (FIG. 11). The gate of transistor 2610 is connected to the drain of transistor 2612 and to a control gate enable terminal CGenbij. The gate of transistor 2612 is connected to the drain of transistor 2610. When GCGij is high (Vcc), CGenbij is grounded by transistor 2616. When GCGij is low (ground), and Vpmatxij is above the threshold voltage of transistor 2612, the terminal CGenbij is connected to terminal Vpmatxij.

The drain of transistor 2610 is connected to source line enable terminal SLenij through high voltage NMOS transistor 2620 and also through high voltage PMOS transistor 2622. The gate of transistor 2622 is connected to terminal CGenbij, and the body region of transistor 2622 is connected to terminal Vpmatxij. The gate of transistor 2620 receives the signal PGMslselij (FIG. 21). High voltage PMOS transistor 2628 is connected between the terminal Vpmatxij, SLenij. The body region of transistor 2628 is connected to terminal Vpmatxij. The gate receives the signal PGMslselij.

Each control gate signal CGi<x>, x=0, 1, 2, 3 is generated by two respective high voltage transistors 2630, 2632 connected in a CMOS inverter configuration. Each transistor 2630 is a PMOS transistor connected between the respective control gate line CGi<x> and terminal Vpcmatxij<x> (FIG. 17). The body regions of transistors 2630 are connected to terminal Vpmatxij. Each transistor 2632 is an NMOS transistor connected between the respective control gate line CGi<x> and the terminal Veci (FIG. 23). The body regions of transistors 2632 are connected to terminal Veci. The gates of transistors 2630, 2632 are connected to terminal CGenbij.

Terminal SLenij is connected to the gates of four high voltage NMOS transistors 2640. One source drain region of each transistor 2640 is connected to one of the four source lines SLi<x> (x =0, 1, 2, 3). The other source/drain region of each transistor 2640 is connected to the respective terminal Vpsmatxij<x> (FIG. 19).

FIGS. 28, 29 illustrate a circuit that forms part of sector decoder 462. Each such circuit generates a respective bias signal Vebi biasing a respective P well 124 (FIG. 1). Terminal Vpsb connected to the source and body regions of high voltage PMOS transistors 2810, 2812. The drain regions of transistors 2810, 2812 are connected respectively to the drain regions of high voltage NMOS transistors 2814, 2816. The source of transistor 2816 is at ground. The gate of transistor 2812 is connected to the drain of transistor 2810. The gate of transistor 2810 is connected to the drain of transistor 2812. The gate of transistor 2114 is at Vcc.

High voltage PMOS transistors 2822.01, 2822.02, 2822.03 are connected in series between the terminals Vpsb and Vebi. The body regions of the three transistors are connected to the terminal Vpsb. The source and drain regions of transistors 2822.01, 2822.02 are interconnected connected together by fuses that can be optionally blown in the manufacturing process. Resistor R1 is connected in series between the terminal Vebi and the drain of high voltage NMOS transistor 2824. The source of transistor 2824 is grounded.

The gates of transistors 2822.01, 2822.02, 2822.03, 2824 are connected to the drain of transistor 2812.

Terminal Vebi is connected to ground through high voltage NMOS transistor 2828.

Low voltage signals MATXij, MATYij are NANDed by low voltage NAND gate 2830. The output of gate 2830 is NORed with low voltage signal ERArealbi by low voltage NOR gate 2832. ERArealbi is a low voltage signal (active 0V). It becomes 0V at the start of the 0V to −10V transition of Vneg (FIG. 25), and becomes high at the start of the −10V to 0V transition of Vnet.

The output of gate 2830 is connected to the gate of transistor 2828. The output of gate 2832 is connected to the source of transistor 2814 and the gate of transistor 2816.

FIG. 30 is a circuit diagram illustrating a circuit that generates the signal VG_BLij for the circuit of FIG. 6. FIG. 31 shows exemplary voltage levels of some signals.

Signal ERAi (erase master signal, see FIG. 15C) is inverted by inverter 3010. Signal PGMi (program master signal, see FIG. 19) is inverted by inverter 3020. The outputs of inverters 3010, 3020 are NANDed by NAND gate 3030. The output of NAND gate 3030 is NANDed with signal MATXij by NAND gate 3040. The output of NAND gate 3040 is delivered to the input of a CMOS inverter formed by NMOS transistor 3050 and PMOS transistor 3060. The output of this inverter provides the signal VG_BLij.

The circuit of FIG. 30 is a low voltage circuit.

The invention is not limited to the embodiments described above. For example, in FIG. 3A, the wordline decoding is not hierarchical (there is no local wordline decoding like for the bitlines). Other embodiments use hierarchical wordline decoding. Also, the bitline, source line and control gate line decoding may or may not be hierarchical. For example, asymmetric transistors 610 (FIG. 8) can be present in embodiments without hierarchical decoding. The source/drain regions 620 having a higher junction breakdown voltage are connected to the bitlines, and source/drain regions 630 having a lower junction breakdown voltage are connected to a Y multiplexer or some other circuit (e.g. a sense amplifier) that drives the bitlines and/or senses the bitline states. In the memory of FIG. 1, a source line SL can be an N+ region in substrate 104, or can be a conductive line overlying the substrate and connected to source line regions 152. Likewise, the control gate lines CGL can be made from the same conductive layer as the individual control gates 140, or from a different conductive layer. An integrated circuit may contain multiple memory mats or arrays, with some of the mats or arrays being within the scope of the present invention and others outside of the scope of the invention. Other embodiments and variations are within the scope of the invention, as defined by the appended claims.

The invention claimed is:

1. An integrated circuit comprising:
    a plurality of nonvolatile memory cells;
    a bitline connected to the nonvolatile memory cells; and
    a transistor having a first source/drain region connected to the bitline and a second source/drain region that has a lower junction breakdown voltage than the first source/drain region.

2. The integrated circuit of claim 1 wherein the second source/drain region has a smaller area than the first source/drain region.

3. The integrated circuit of claim 1 wherein the first source/drain region is a double diffused drain region, but the second source/drain region is not a double diffused drain region.

4. The integrated circuit of claim 1 wherein the first and second source/drain regions have a first conductivity type, each of the first and second source/drain regions has a junction with a region of a second conductivity type, and the maximum doping concentration of the first source/drain region at the junction between the first source/drain region and the region of the second conductivity type is lower than the maximum doping concentration of the second source/drain region at the junction between the second source/drain region and the region of the second conductivity type.

5. The integrated circuit of claim 1 wherein a voltage on the bitline has a higher maximum magnitude than a voltage on the second source/drain region.

6. The integrated circuit of claim 1 wherein:
    each of the plurality of the nonvolatile memory cells comprises a first semiconductor region connected to the bitline, and a second semiconductor region adjoining the first semiconductor region and having an opposite conductivity type from the first semiconductor region;
    in at least one memory writing operation, the second semiconductor regions of the plurality of the nonvolatile memory cells are driven to a first voltage while the bitline is floating, wherein driving the second semiconductor regions to the first voltage causes the voltage on the bitline to be at a higher maximum magnitude than a maximum magnitude of the voltage on the second source/drain region.

7. The integrated circuit of claim 1 wherein the transistor is to be used to drive the bitline and/or sense a state of the bitline.

8. The integrated circuit of claim 1 comprising a plurality of arrays of nonvolatile memory cells, wherein said plurality of nonvolatile memory cells is one column of one of the arrays, wherein the bitline is one of a plurality of bitlines, wherein each nonvolatile memory cell comprising a first semiconductor region, and each bitline is connected to the first semiconductor regions of a respective column of the memory cells in one of the arrays;

wherein the integrated circuit further comprises a plurality of global bitlines, each global bitline associated with a plurality of bitlines in each of at least two of the arrays, wherein each global bitline is operable to be connected to at least one of the associated bitlines in response to a bitline selection signal;

wherein the transistor is one of a plurality of transistors, wherein each transistor of said plurality has a first source/drain region connected to one of the bitlines and a second source/drain region connected to one of the global bitlines, the transistor being controlled by the bitline selection signal.

9. The integrated circuit of claim 1 further comprising a sense amplifier for sensing a state of the bitline when any one of said memory cells is being read;

wherein said transistor is turned on to couple the bitline to the sense amplifier during a memory read operation when any one of said memory cells is being read, but said transistor is turned off in a memory read operation when said bitline is not selected.

10. The integrated circuit of claim 8 wherein each said transistor is turned on to drive the associated bitline with a constant voltage when the associated bitline is not selected during a memory read operation, but each said transistor is turned off when the associated bitline is selected in a memory read operation.

11. The integrated circuit of claim 1 further comprising a semiconductor substrate comprising one or more first wells and a second well;

wherein said memory cells have a plurality of source/drain regions of a first conductivity type in the one or more first wells;

wherein said transistor's first and second source/drain regions are regions of the first conductivity type in the second well;

wherein the first and second wells have a second conductivity type, and the one or more first wells are isolated from the second well.

12. A method for writing a nonvolatile memory comprising a plurality of nonvolatile memory cells each of which has a channel region and a semiconductor region adjoining the channel region and connected to a bitline, the method comprising providing a first super high voltage to the channel regions of the nonvolatile memory cells and, at the same time, disabling a transistor having a first source/drain region connected to the bitline and having a second source/drain region that has a lower junction breakdown voltage than the first source/drain region.

13. The method of claim 12 wherein the second source/drain region has a smaller area than the first source/drain region.

14. The method of claim 12 wherein the first source/drain region is a double diffused drain region, but the second source/drain region is not a double diffused drain region.

15. The method of claim 12 wherein the first and second source/drain regions have a first conductivity type, each of the first and second source/drain regions has a junction with a region of a second conductivity type, and the maximum doping concentration of the first source/drain region at the junction between the first source/drain region and the region of the second conductivity type is lower than the maximum doping concentration of the second source/drain region at the junction between the second source/drain region and the region of the second conductivity type.

16. The method of claim 12 wherein providing the first super high voltage to the channel regions causes the bitline to be at a super high voltage.

17. An integrated circuit comprising:

a plurality of arrays of nonvolatile memory cells, each array comprising a plurality of rows of the memory cells and a plurality of columns of the memory cells, wherein each memory cell comprises a first region, and the first regions of the memory cells in each row of each array are connected together via a first conductive line;

wherein when the memory cells are read, one or more voltages are applied to the memory cells, wherein all of the one or more voltages applied to the memory cells for reading the memory cells are in a predetermined range from a predetermined voltage V1 to a predetermined voltage V2, wherein V2≧V1;

wherein when the memory cells are written in a first writing operation, a voltage V3 is applied to the first regions of the memory cells, the voltage V3 being outside of the range from V1 to V2;

wherein the integrated circuit further comprises:

a first decoding circuit for selecting the first lines and providing selection signals on one or more lines L1 extending in the row direction;

for each of the arrays, a corresponding second decoding circuit for receiving one or more of the selection signals from one or more of the lines L1 and for driving one or more of the first lines of the corresponding array;

wherein all of the selection signals which are provided by the first decoding circuit for selecting the first lines in the first writing operation and which are carried to the second decoding circuits are in the range from V1 to V2.

18. The integrated circuit of claim 17 further comprising a circuit for providing one or more voltages on one or more lines L2 extending in the column direction;

wherein the second decoding circuits receive from the lines L2 one or more voltages which are outside of the range from V1 to V2, to provide the voltage V3 to the first regions.

19. The integrated circuit of claim 17 wherein each first region is a source line region which is a source/drain region of the memory cell.

20. The integrated circuit of claim 17 wherein each first region is a control gate.

21. The integrated circuit of claim 20 wherein each cell further comprises a source line region which is a source/drain region of the memory cell, and the source line regions of the memory cells in each row of each array are connected together via a conductive source line;

wherein when the memory cells are written in a second writing operation which is the same as, or different from, the first writing operation, a voltage V4 outside of the range from V1 to V2 is applied to the source line regions of the memory cells, the voltage V4 having the same value as V3 or a different value from V3;

wherein the selection signals provided by the first decoding circuit on the lines L1 in the second writing operation include signals for selecting the source lines;

wherein the second decoding circuits are for driving one or more of the source lines of the corresponding array;

wherein all of the selection signals which are provided by the first decoding circuit for selecting the source lines in the second writing operation and which are carried to the second decoding circuits are in the range from V1 to V2.

22. The integrated circuit of claim 21 further comprising a circuit for providing one or more voltages on one or more lines L2 extending in the column direction;

wherein the second decoding circuits receive from the lines L2 one or more voltages which are outside of the range from V1 to V2, to provide the voltages V3, V4 to the memory cells in the first and second writing operations.

23. The integrated circuit of claim 21 wherein each memory cell further comprises a select gate, and the select gates of the memory cells in each row of each array are connected together via a conductive wordline;

wherein the wordlines are driven by the first decoding circuit.

24. A method for writing a nonvolatile memory comprising a plurality of memory arrays, the method comprising:

providing one or more first voltages for selecting one or more first lines, wherein each first line interconnects first regions of the memory cells in one row of one of the arrays;

providing one or more second voltages;

for each array, receiving first and second voltages and driving the first lines, in response to the first and second voltages, with voltages for writing one or more of the memory cells;

wherein all of the first voltages are carried by lines L1 extending in the row direction of the arrays, and all of the second voltages are carried by lines L2 extending in the column direction of the array;

wherein all of the first voltages are not higher in magnitude than a power supply voltage Vcc; and at least one of the second voltages is higher in magnitude than Vcc.

25. The method of claim 24 wherein the memory arrays are part of an integrated circuit; and the method further comprises generating said at least one of the second voltages by a charge pump which is part of said integrated circuit.

26. The method of claim 24 wherein each first line is a source line interconnecting first source/drain regions of the memory cells in one row of one of the arrays.

27. The method of claim 24 wherein each first line is a control gate line interconnecting control gates of the memory cells in one row of one of the arrays.

28. The method of claim 24 wherein the first lines comprise:

source lines each of which interconnects first source/drain regions of the memory cells in one row of one of the arrays; and control gate lines each of which interconnects control gates of the memory cells in one row of one of the arrays.

29. An integrated circuit comprising:

at least a first array and a second array of nonvolatile memory cells, each memory cell comprising a conductive floating gate, a conductive control gate, and a conductive select gate which are insulated from each other, and also comprising at least a first source/drain region;

wherein the memory cells of each array form a plurality of rows, and in each row the control gates are electrically connected to each other via a first conductive line, and the first source/drain regions are electrically connected to each other via a second conductive line;

wherein the integrated circuit further comprises:

a first decoding circuit for selecting a plurality of first conductive lines and a plurality of second conductive lines in each of the first and second arrays; and for each of the first and second arrays, a second decoding circuit for selecting one or more, but less than all, of the first conductive lines selected by the first decoding circuit for the corresponding array, and for selecting one or more, but less than all, of the second conductive lines selected by the first decoding circuit for the corresponding array;

wherein each second decoding circuit is located in an area spaced from the first and second arrays.

30. The integrated circuit of claim 29, wherein each second decoding circuit comprises:

a first PMOS transistor for providing a voltage to the one or more first conductive lines selected by the second decoding circuit, the voltage having a higher magnitude than any voltage provided to any one of the memory cells during a reading operation; and a second PMOS transistor for providing a voltage to the one or more second conductive lines selected by the second decoding circuit, the voltage having a higher magnitude than any voltage provided to any one of the memory cells during a reading operation;

wherein each of the first and second PMOS transistors has source/drain regions and a channel region, and wherein the source/drain regions and the channel regions of the first and second transistors are located in a contiguous N type semiconductor region.

31. The integrated circuit of claim 29, wherein each second decoding circuit comprises:

a first NMOS transistor for providing a voltage to the one or more first conductive lines selected by the second decoding circuit, the voltage having a higher magnitude than any voltage provided to any one of the memory cells during a reading operation; and a second NMOS transistor for providing a voltage to the one or more second conductive lines selected by the second decoding circuit, the voltage having a higher magnitude than any voltage provided to any one of the memory cells during a reading operation;

wherein each of the first and second NMOS transistors has source/drain regions and a channel region, and wherein the source/drain regions and the channel regions of the first and second transistors are located in a contiguous P type semiconductor region.

32. An integrated circuit comprising:

a plurality of nonvolatile memory cells;

a bitline connected to the nonvolatile memory cells; and a transistor having a first source/drain region connected to the bitline and a second source/drain region that has a smaller area than the first source/drain region.

33. The integrated circuit of claim 32 further comprising a sense amplifier for sensing a state of the bitline when any one of said memory cells is being read;

wherein said transistor is turned on to couple the bitline to the sense amplifier during a memory read operation when any one of said memory cells is being read, but said transistor is turned off in a memory read operation when said bitline is not selected.

34. The integrated circuit of claim 32 wherein said transistor is turned on to drive the bitline with a constant voltage when the bitline is not selected during a memory read operation, but said transistor is turned off when the bitline is selected in a memory read operation.

35. The integrated circuit of claim 32 further comprising a semiconductor substrate comprising one or more first wells and a second well;
- wherein said memory cells have a plurality of source/drain regions of a first conductivity type in the one or more first wells;
- wherein said transistor's first and second source/drain regions are regions of the first conductivity type in the second well;
- wherein the first and second wells have a second conductivity type, and the one or more first wells are isolated from the second well.

36. An integrated circuit comprising:
- a plurality of nonvolatile memory cells;
- a bitline connected to the nonvolatile memory cells; and
- a transistor having a first source/drain region connected to the bitline and a second source/drain region, wherein the first and second source/drain regions have a first conductivity type, each of the first and second source/drain regions has a junction with a region of a second conductivity type, and the maximum doping concentration of the first source/drain region at the junction between the first source/drain region and the region of the second conductivity type is lower than the maximum doping concentration of the second source/drain region at the junction between the second source/drain region and the region of the second conductivity type.

37. The integrated circuit of claim 36 further comprising a sense amplifier for sensing a state of the bitline when any one of said memory cells is being read;
- wherein said transistor is turned on to couple the bitline to the sense amplifier during a memory read operation when any one of said memory cells is being read, but said transistor is turned off in a memory read operation when said bitline is not selected.

38. The integrated circuit of claim 36 wherein said transistor is turned on to drive the bitline with a constant voltage when the bitline is not selected during a memory read operation, but said transistor is turned off when the bitline is selected in a memory read operation.

39. The integrated circuit of claim 36 further comprising a semiconductor substrate comprising one or more first wells and a second well;
- wherein said memory cells have a plurality of source/drain regions of a first conductivity type in the one or more first wells;
- wherein said transistor's first and second source/drain regions are regions of the first conductivity type in the second well;
- wherein the first and second wells have a second conductivity type, and the one or more first wells are isolated from the second well.

* * * * *

UNITED STATES PATENT AND TRADEMARK OFFICE
CERTIFICATE OF CORRECTION

| | |
|---|---|
| PATENT NO. | : 7,046,551 B2 |
| APPLICATION NO. | : 10/397478 |
| DATED | : May 16, 2006 |
| INVENTOR(S) | : Jongmin Park and Li-Chun Li |

Page 1 of 1

It is certified that error appears in the above-identified patent and that said Letters Patent is hereby corrected as shown below:

Col. 4, line 29, delete "cell 10" and insert --cell 110--

Col. 4, line 42, delete "cell 10" and insert --cell 110--

Signed and Sealed this

Eighth Day of January, 2008

JON W. DUDAS
*Director of the United States Patent and Trademark Office*